United States Patent [19]
Makiyama et al.

[11] Patent Number: 5,818,078
[45] Date of Patent: Oct. 6, 1998

[54] SEMICONDUCTOR DEVICE HAVING A REGROWTH CRYSTAL REGION

[75] Inventors: Kozo Makiyama; Masahiko Takikawa; Satoru Asai; Yusuke Matsukura; Toshihide Kikkawa, all of Kawasaki, Japan

[73] Assignee: Fujitsu Limited, Kanagawa, Japan

[21] Appl. No.: 517,041

[22] Filed: Aug. 21, 1995

[30] Foreign Application Priority Data

Aug. 29, 1994 [JP] Japan ................................. 6-203311
Sep. 7, 1994 [JP] Japan ................................. 6-213440
Sep. 16, 1994 [JP] Japan ................................. 6-222237

[51] Int. Cl.$^6$ ........................... H01L 29/90; H01L 31/112
[52] U.S. Cl. ............................................ 257/281; 257/280
[58] Field of Search ................................. 257/281, 280

[56] References Cited

U.S. PATENT DOCUMENTS 5,235,210 8/1993 Inoue .

FOREIGN PATENT DOCUMENTS

| 58-32472 | 2/1983 | Japan . |
| 59-152669 | 8/1984 | Japan . |
| 61-170073 | 7/1986 | Japan . |
| 62-32660 | 2/1987 | Japan . |

*Primary Examiner*—Stephen Meier
*Attorney, Agent, or Firm*—Armstrong, Westerman, Hattori, McLeland & Naughton

[57] ABSTRACT

A method of fabricating a compound semiconductor device includes a step of removing a semiconductor layer by an etching process to expose an upper major surface of an underlying semiconductor layer, followed by a growth of another semiconductor layer of the p-type on the surface thus exposed, wherein the exposed surface is cleaned by a flushing of a gaseous metal organic compound containing a group V element for removing impurities therefrom and further doping the exposed surface to the p-type.

17 Claims, 18 Drawing Sheets

5,818,078

SEMICONDUCTOR DEVICE HAVING A REGROWTH CRYSTAL REGION

BACKGROUND OF THE INVENTION

The present invention generally relates to semiconductor devices and more particularly to a semiconductor device having a crystal region formed of a regrowth process.

Compound semiconductor devices that use a compound semiconductor material for the essential part of the device, are used extensively for various high speed semiconductor devices such as MISFET, HEMT or HBT. It should be noted that such a compound semiconductor material has a characteristic band structure that provides a very small effective mass of electrons. Particularly, a HEMT induces a two-dimensional electron gas in an undoped compound semiconductor layer acting as an active layer, along a heterojunction interface thereof at which the active layer contacts with another, doped compound semiconductor layer. In such a structure, the electrons are transported through the two-dimensional electron gas without experiencing substantial scattering by dopant atoms.

In such high speed compound semiconductor devices, the parasitic resistance of the current path through the device provides a substantial effect upon the operational speed of the device. When the source resistance or drain resistance of a FET such as HEMT or MESFET is increased, for example, the operational speed of the device is inevitably deteriorated even when the semiconductor device itself operates very fast. Further, the reduction of the source or drain resistance is essential for realizing a complementary compound semiconductor device that includes a P-channel compound semiconductor device and an N-channel compound semiconductor device. As is well known in the art, N-channel compound semiconductor devices operate very fast because of the small effective mass of the electrons in the compound semiconductor material, while P-channel compound semiconductor devices operate less fast because of the relatively large effective mass of the holes. In order to operate such complementary devices successfully, it is therefore necessary and desirable to increase the operational speed of the slower P-channel device such that the P-channel and N-channel devices operate at a generally identical speed. For this purpose, decrease of the source or drain resistance of the P-channel device is particularly important.

FIG. 1 shows the structure of a typical conventional HEMT.

Referring to FIG. 1, the HEMT includes a channel layer 13 of undoped GaAs provided upon a semi-insulating GaAs substrate 11, wherein a buffer layer 12 of undoped GaAs is interposed between the substrate 11 and the channel layer 13. On the channel layer 13, there is provided an electron supplying layer 14 of a wide gap material such as AlGaAs, wherein the electron supplying layer 14 is doped to the n-type and supplies electrons to the channel layer 13. Thereby, the electrons thus supplied form a two-dimensional electron gas 13a in the channel layer 13 along the interface between the layer 13 and the layer 14. Further, a cap layer 15 of GaAs is provided on the electron supplying layer 14 for protecting the same from oxidation, wherein the cap layer 15 is doped to the n$^+$-type for reducing the resistivity thereof as much as possible, and an opening 15a is provided on the layer 15 so as to expose the surface of the electron supplying layer 14 in correspondence to the channel region of the device.

On the exposed surface of the electron supplying layer 14, on the other hand, there is provided a Schottky electrode 16 as a gate electrode, and source and drain electrodes $18_1$ and $18_2$ are provided on the cap layer 15 at both sides of the gate electrode 16. Thereby, the thickness of the electron supplying layer 14 is set so as to provide a desired threshold voltage. Further, an insulation layer 17 of SiON covers the exposed surface of the cap layer 15.

In such a structure, electrons are injected to the two-dimensional electron gas 13a in the channel layer 13 from the source electrode $18_1$ via the cap layer 15 and further via the electron supplying layer 14, and are collected by the drain electrode $18_2$ via the electron supplying layer 14 and the cap layer 15, after passing through the channel region along the two-dimensional electron gas 13a. Thereby, the flow of the electrons through the channel region is controlled by a depletion region extending from the gate electrode 16, wherein the extent of the depletion region is controlled by a control voltage applied to the gate electrode.

FIG. 2 shows the structure of a DMT (doped-channel MIS-like FET), a type of MISFET designed to minimize the gate current in a conventional MESFET. In a MESFET, and also in a HEMT as well, in which the gate electrode is provided directly upon a doped channel layer or electron supplying layer, it should be noted that a gate current may cause a leak depending upon the voltage applied to the gate electrode.

Referring to FIG. 2, the DMT is constructed on a semi-insulating GaAs substrate 21 and includes an n-type GaAs channel layer 23, with an undoped GaAs buffer layer 22 intervening between the substrate 21 and the channel layer 23. In the DMT, an undoped AlGaAs layer 24 is further provided on the channel layer 23 as a barrier layer, and a cap layer 25 of n$^+$-type GaAs layer 25 is provided on the barrier layer 24. It should be noted that AlGaAs forming the barrier layer 24 has a bandgap much larger than that of GaAs and acts as an effective barrier against the electrons that may leak in the form of gate current. Further, the cap layer 25 is formed with a contact window 25a that exposes the surface of the barrier layer 24, and a Schottky electrode 26 is provided upon such an exposed surface of the barrier layer 24 as a gate electrode. Further, ohmic electrodes $28_1$ and $28_2$ are provided on the cap layer 25 at both sides of the gate electrode 26, as source and drain electrodes, and the exposed surface of the cap layer 25 is covered by an insulator layer 27 of SiON.

In operation, electrons are injected into the channel layer 23 from the source electrode $28_1$ and are recovered by the drain electrode $28_2$ after passing through the n-type channel layer 23 as indicated by arrows and broken lines in FIG. 2, wherein the flow of the electrons through the channel layer 23 is controlled by a depletion region extending from the gate electrode 26 as usual in a FET.

In the structure of FIG. 2, it should be noted that the metal elements such as Au and Ge cause a diffusion from the ohmic electrodes $28_1$ or $28_2$ into the layer 25 and further into the layer 24 as indicated by a hatched region. In such a diffusion process, the concentration level of the metal elements diminishes gradually toward the active layer 23, and the hatched diffusion region may not reach the active layer 23, depending upon the thicknesses of the layers 25 and 24. When this is the case, the injection of the carriers into the active layer 23 is substantially blocked by the barrier layer 24, and the current paths indicated in FIG. 2 by arrows are interrupted as indicated by cross marks. As the thickness of the barrier layer 24 determines the threshold voltage and the gate leak current of the device, it is not possible to reduce the thickness of the layer 24 as desired. The thickness of the barrier layer 24 is determined as a result of trade-off of the threshold voltage of the device and the gate leak current. Thus, the conventional DMT of FIG. 3 has suffered from the problem of large resistance of the current path through the device.

In order to inject the electrons into the channel layer 23 with reliability, the inventor has proposed to form a recessed structure in the device in correspondence to the source and drain regions as indicated in FIG. 3 by an etching process, such that a regrowth of a doped crystal region is made on such a recessed region as source and drain regions.

Referring to FIG. 3, the recessed region is formed at both sides of the gate electrode 26 so as to reach the channel layer 23, wherein the recessed region thus formed is defined by a bottom surface 23a formed at a level below the level of the top surface of the channel layer 23. As a result of the formation of the recess, it will be noted that a ridge structure is formed by the remaining layers 24 and 25.

In the structure of FIG. 3, it should be noted that there are provided n$^+$-type GaAs regions 29a and 29b epitaxially on the respective recessed surfaces 23a so as to fill the recessed regions thus formed, and the source and drain electrodes $28_1$ and $28_2$ are provided respectively on the foregoing n$^+$-type regions 29a and 29b. Thereby, the regions 29a and 29b are formed as a result of the regrowth process. As the n$^+$-type regions 29a and 29b reach the channel layer 23 in the structure of FIG. 3, the injection and recovery of the electrons to and from the channel layer 23 is achieved positively, and the source or drain resistance of the device is substantially reduced.

On the other hand, the structure of FIG. 3 has a drawback in that the channel layer 23 experiences etching when forming the recessed region, while such an etching tends to damage the recessed surface 23a of the channel layer 23. When the channel layer 23 experiences such a damage, the source or drain resistance of the device increases inevitably. Further, the level or vertical position of the surface 23a inside the channel layer 23 is difficult to control because of the absence of any etching stopper in the layer 23. In addition, such a structure tends to invite a short channel effect, particularly when the gate length is reduced for high speed operation, in that the electrons tend to flow through the channel layer 23 through a bottom part thereof as indicated in FIG. 4 by a broken line. It should be noted that such a current path at the bottom part of the channel layer may not be effectively interrupted even when a control voltage is applied to the gate electrode 26 so as to interrupt the carriers that flow along the top surface of the channel layer 23. Thus, the device of FIG. 3 tends to show a small threshold voltage. It should be noted that the foregoing problem of increased source resistance occurs not only in HEMTs or MISFETs but also in a HBT.

FIG. 4 shows an example of a conventional complementary compound semiconductor integrated circuit, wherein the illustrated example includes a first HEMT and a second HEMT on a common substrate, the first HEMT including a two-dimensional electron gas while the second HEMT including a two-dimensional hole gas.

Referring to FIG. 4, the complementary device is constructed upon a semi-insulating GaAs substrate 31 on which is provided a semi-insulating GaAs buffer layer 32 with a thickness of about 600 nm. The buffer layer 32, in turn, carries thereon a channel layer 33 of an undoped InGaAs with a thickness of 14 nm, and an electron supplying layer 34 of n-type AlGaAs is provided on the channel layer 33 with a thickness of 30 nm. Further, a contact layer 35 of n-type GaAs is provided on the electron supplying layer 34 with a thickness of 50 nm, wherein the contact layer 35 is formed with an opening 35a in correspondence to a first region A as indicated in FIG. 4 so as to expose the upper major surface of the electron supplying layer 34, and a Schottky electrode 35A is provided on the exposed surface of the electron supplying layer 34 as a gate electrode. Thereby, a two-dimensional electron gas 33a is formed in the channel layer 33 that has a larger electron affinity over the electron supplying layer 34, wherein the two-dimensional electron gas 33a is formed along the interface between the channel layer 33 and the electron supplying layer 34. Further, ohmic electrodes 35B and 35C are provided on the contact layer 35 in correspondence to the foregoing region A, for injecting and recovering electrons to and from the two-dimensional electron gas. In other words, an ordinary HEMT is formed in the region A of the device of FIG. 4.

In the complementary device of FIG. 4, it should be noted that an undoped InGaP layer 36 is provided on the contact layer 35 in correspondence to a region B that is defined adjacent to the region A as an etching stopper, and a buffer layer 37 of undoped GaAs is provided on the etching stopper layer 36 with a thickness of 100 nm. On the buffer layer 37, there is provided a channel layer 38 of undoped InGaAs with a thickness of 14 nm, and a hole supplying layer of p-type AlGaAs is provided on the channel layer 38 with a thickness of 25 nm. It should be noted that the hole supplying layer 39 has a composition of $Al_{0.7-0.8}Ga_{0.2-0.3}As$ and provides a very large bandgap. Thereby, a two-dimensional hole gas 38a is formed in the channel layer 38 similarly to the case of the channel layer 33, along the interface between the layer 38 and the layer 39. Further, a Schottky electrode 39A is provided on the hole supplying layer 39 as a gate electrode, wherein a thin undoped GaAs layer 39a is interposed between the layer 39 and the gate electrode 39A for improving the breakdown characteristics of the device and for eliminating the gate current leak. In addition, ohmic electrodes 39B and 39C are provided on the hole supplying layer 39 at both sides of the gate electrode 39A, respectively as source and drain electrodes. As a result, it will be noted that a high hole-mobility transistor is formed in the region B of the device, wherein the high hole mobility transistor will be designated also as HEMT in the following description for the sake of simplicity.

As the effective mass of a hole is generally larger than the effective mass of an electron in a III–V compound semiconductor material, the mobility of a hole in the two-dimensional gas 38a is substantially smaller than the mobility of an electron in the two-dimensional electron gas 33a. Thus, the complementary device of FIG. 4 shows a problem that the operation of the hole HEMT in the region B cannot catch up the operation of the electron HEMT in the region A. As a result of such a difference in the mobility of carriers, there emerges a problem of increased resistance Rs in the device of FIG. 4, wherein the resistance Rs represents the resistance that a hole experiences between the source electrode 39B and the gate electrode 39A.

In order to eliminate the foregoing problem of conventional complementary HEMT, efforts have been made to reduce the distance between the source electrode 39B and the gate electrode 39A as much as possible so as to increase the operational speed of the hole HEMT in the region B as much as possible. However, such an approach has been difficult as long as the electrodes 39A is formed of a material different from the material that forms the electrodes 39A and 39C. In such a case, it is necessary to first form one of the electrodes such as the electrode 39A, followed by a deposition of an insulation layer so as to cover the electrode 39A. The other electrode is then formed by providing a contact hole in the insulation layer. However, such a fabrication process inevitably results in a structure in which the first electrode such as the electrode 39A is separated from the second electrode such as the electrode 39B by an insulation region, and is not suitable for forming the electrodes 39A and 39B with a minimum separation.

In order to overcome the foregoing problem, a structure shown in FIG. 5 is proposed, wherein those parts described previously are designated by the same reference numerals and the description thereof will be omitted.

Referring to FIG. 5, a conductor layer corresponding to the gate electrode 39A is deposited upon the layer 39a, followed by a patterning process to form the gate electrode 39A. Further, the semiconductor layer 39a as well as the semiconductor layer 39 underneath the layer 39a are removed by a dry etching process except for a region $(39A)_1$ located immediately under the gate electrode 39A. Thereby, the upper major surface of the channel layer 38 is exposed at both sides of the region $(39A)_1$. Next, crystal regions $(39B)_1$ and $(39C)_1$ both of p-type AlGaAs or GaAs are grown epitaxially on the exposed surface of the layer 38 by a MOCVD process such that the regions $(39B)_1$ and $(39C)_2$ are formed at both sides of the foregoing region $(39A)_1$.

In the structure of FIG. 5, it should be noted that each of the crystal regions $(39B)_1$ and $(39C)_1$ is formed of a single crystal of p-type AlGaAs or GaAs defined laterally by a crystal surface. For example, the region $(39B)_1$ is defined by crystal surfaces $39B_{-1}$ and $39B_{-2}$, while the region $(39C)_1$ is defined by crystal surfaces $39C_{-1}$ and $39C_{-2}$. Thereby, the crystal surfaces $39B_{-1}$ and $39B_{-2}$ or $39C_{-1}$ and $39C_{-2}$ are inclined with a predetermined angle with respect to the upper major surface of the channel layer 38 to form a generally trapezoidal shape when viewed in an elevational cross sectional view as indicated in FIG. 5. In FIG. 5, it will be noted that the top area of the trapezoid is smaller than the base area in each of the regions $(39B)_1$ and $(39C)_1$.

In such a structure, the electrodes 39B and 39C provided respectively on the regions $(39B)_1$ and $(39C)_1$ do not contact with the gate electrode 39A on the region $(39A)_1$, although the region $(39B)_1$ or $(39C)_1$ contacts with the region $(39A)_1$ at the base part thereof. As a result of such a construction, the separation between the electrode 39A and the electrode 39B or between the electrode 39A and the electrode 39C is minimized and the operational speed of the HEMT in the region B is maximized.

In the construction of FIG. 5, however, there exists a problem in that the exposed surface of the channel layer 38 may be contaminated at the time of the dry etching of the semiconductor layer 39, for example by oxygen or other contaminants such as C, Si, Cl, $CH_x$, and the like, that are contained in the etching gas. It should be noted that the compound $CH_x$ is formed as a result of the reaction between C and H originated from $CO_2$ and $H_2O$ in the air. When the semiconductor region $(39B)_1$ or $(39C)_1$ is grown on such a contaminated surface, the contaminants inevitably induce a depletion region at the interface between the layer 38 and the region $(39B)_1$ or $(39C)_1$, while such a depletion region in turn invites an increase of the source resistance or drain resistance of the HEMT as a result of depletion of the carriers.

Conventionally, such a contamination has been removed by processing the exposed surface by $NH_4S_x$, while such a processing tends to cause a deposition of S at the exposed surface of the layer 38. As S acts as a donor, the deposition of S does not cause any problem as long as an n-type layer is grown upon the exposed surface. However, when growing a p-type region $(39B)_1$ or $(39C)_1$ as in the present case, the contamination of the exposed surface by S invites an unwanted formation of p-n junction at the interface. Such a formation of the p-n junction of course invites an increase of the source resistance or drain resistance. It should be noted that the problem of contamination of the interface occurs not only in the complementary HEMT of FIG. 5 but also in the DMT of FIG. 4 in which the source and drain regions 29a and 29b are formed as a regrowth crystal region.

SUMMARY OF THE INVENTION

Accordingly, it is a general object of the present invention to provide a novel and useful compound semiconductor device as well as a fabrication process thereof wherein the foregoing problems are successfully eliminated.

Another object of the present invention is to provide a semiconductor device having a maximum operational speed and minimum source resistance, and a fabrication process of such a semiconductor device.

Another object of the present invention is to provide a semiconductor device having a regrowth crystal region for source and drain regions and a fabrication process thereof, wherein the channel layer is held substantially free from damage and simultaneously the source and drain resistances are minimized.

Another object of the present invention is to provide a semiconductor device having a regrowth crystal region for source and drain regions and a fabrication process thereof, wherein the distance between the source and drain regions is minimized for maximum operational speed of the device.

Another object of the present invention is to provide a semiconductor device having a regrowth crystal region and a fabrication process thereof, wherein the short channel effect is substantially eliminated.

Another object of the present invention is to provide a compound semiconductor device, comprising:
  a channel layer of a first compound semiconductor material having a first bandgap;
  a barrier layer of a second compound semiconductor material having a second, substantially larger bandgap, said barrier layer having an upper major surface and being provided on said conductive channel layer;
  a gate electrode provided on said barrier layer in Schottky contact therewith;
  a cap layer of a third compound semiconductor material having a third bandgap smaller than said second bandgap, said conductive cap layer being provided on said barrier layer;
  a pair of surface regions provided on said barrier layer at both sides of said gate electrode, each of said surface regions being located at a level equal to or lower than said upper major surface of said barrier layer but higher than an upper major surface of said channel layer;
  a pair of ohmic electrodes provided respectively on said pair of surface regions in ohmic contact therewith as source and drain electrodes; and
  a pair of diffusion regions respectively extending from said pair of ohmic electrodes into said barrier layer, each of said diffusion regions reaching said channel layer.

According to the present invention, the source resistance and the drain resistance are reduced substantially due to the diffusion regions that extend from the source and drain electrodes and reach the channel layer. Thereby, it should be noted that the level of the surface regions on which the source and drain electrodes are provided, is set such that the foregoing diffusion regions reach the channel layer. In other words, the level of the foregoing surface regions is chosen independently to the level of the upper major surface of the barrier layer and hence the threshold voltage of the device. It should be noted that the level of the upper major surface of the barrier layer, on which the gate electrode is provided, determines the threshold voltage of the device.

Another object of the present invention is to provide a compound semiconductor device, comprising:

a channel layer of a first compound semiconductor material having a first bandgap;

a barrier layer of a second compound semiconductor material having a second, substantially larger bandgap, said barrier layer having an upper major surface and being provided on said conductive channel layer;

a gate electrode provided on said barrier layer in Schottky contact therewith;

a cap layer of a third compound semiconductor material having a third bandgap smaller than said second bandgap, said conductive cap layer being provided on said barrier layer;

a pair of surface regions provided on said barrier layer at both sides of said gate electrode, each of said surface regions being located at a level equal to or lower than said upper major surface of said barrier layer but higher than an upper major surface of said channel layer; and a pair of ohmic electrodes provided respectively on said pair of surface regions in ohmic contact therewith as source and drain electrodes;

wherein said level of said surface regions is set such that a depletion region associated with said surface region does not reach said channel layer.

According to the present invention, the depletion region does not penetrate into the channel layer and the injection and/or recovery of carriers to and from the channel layer is achieved efficiently. Associated therewith, the source and drain resistances of the device decrease substantially.

Another object of the present invention is to provide a semiconductor device, comprising:

an etching stopper layer of a first compound semiconductor material, said etching stopper layer having an upper major surface;

channel layer means for transporting carriers therethrough, said channel layer means having an upper boundary at a level equal to or lower than said upper major surface of said etching stopper layer, said channel layer means including a compound semiconductor material having a first bandgap;

a barrier layer of a second compound semiconductor material having a second bandgap substantially larger than said first bandgap, said barrier layer being provided upon said etching stopper layer and defined laterally by first and second, mutually opposing side walls;

a gate electrode provided on said barrier layer in Schottky contact therewith;

a first regrowth layer of a single crystal of a third compound semiconductor material having a bandgap substantially smaller than said second bandgap, said first regrowth layer being defined by a side wall of a crystal surface and provided upon said etching stopper layer in a state that said side wall of said first regrowth layer contacts with said first side wall of said barrier layer;

a second regrowth layer of a single crystal of said third compound semiconductor material, said second regrowth layer being defined by a side wall of a crystal surface and provided upon said etching stopper layer in a state that said side wall of said second regrowth layer contacts with said second side wall of said barrier layer;

a first ohmic electrode provided on said first regrowth layer in ohmic contact therewith as a source electrode; and a second ohmic electrode provided on said second regrowth layer in ohmic contact therewith as a drain electrode;

wherein said first compound semiconductor material has a composition such that said etching stopper is substantially immune to an etching process that is effective upon said second compound semiconductor material.

According to the present invention, the source and drain regions are contacted with the barrier layer located immediately under the gate electrode, and the separation between the source and drain regions is minimized. Associated therewith, the source resistance or drain resistance of the device is minimized. As the first and second regrowth layers are grown upon the etching stopper layer that is substantially immune to the etching, the injection of the carriers into the channel layer forming the channel means is achieved inevitably at the top surface of the channel layer, not at the side wall of the channel layer. Thereby, the problem of short-channel effect caused by the carriers injected to the channel layer at the side wall thereof is effectively eliminated. In a preferred embodiment of the present invention, the etching stopper layer itself may be used as the channel layer.

Another object of the present invention is to provide a method for fabricating a compound semiconductor device, comprising the steps of:

forming a second compound semiconductor layer of the n-type upon a first compound semiconductor layer;

removing said second compound semiconductor layer selectively with respect to said first compound semiconductor layer in a predetermined region defined on said second compound semiconductor layer, such that a surface of said second compound semiconductor layer is exposed;

cleaning said exposed surface of said first compound semiconductor layer, said step of cleaning comprising a step of supplying a gaseous metal organic material upon said exposed surface of said first compound semiconductor layer without causing a substantial growth of a semiconductor layer thereupon; and growing, after said step of cleaning, a third compound semiconductor layer of the p-type upon said exposed surface of said first compound semiconductor layer.

According to the present invention, the impurity such as oxygen (O), Si, Cl or $CH_x$ that contaminates the exposed surface of the first compound semiconductor layer at the time of the selective etching process, is removed effectively as a result of the cleaning step that employs a flushing of the exposed surface of the first compound semiconductor material by the gaseous metal organic material. As a result of the removal of the impurity, the occurrence of carrier depletion at the interface between the first compound semiconductor layer and the third compound semiconductor layer is successfully suppressed. In such a process, it should be noted that the gaseous metal organic material does not contain any n-type dopant. Thus, the doping to the n-type never occurs at the foregoing interface on which the third compound semiconductor layer is grown with the p-type. Associated with such a cleaning of the foregoing interface, the resistance of the current path through the foregoing interface is reduced substantially, and the operational speed of the semiconductor device increases accordingly. For example, it is possible to construct a complementary HEMT in which a normal N-channel HEMT and a P-channel HEMT are integrated upon a common substrate, by minimizing the source and drain resistances of the P-channel HEMT. Further, the present invention is effective for fabricating a high-speed HBT that includes a NPN heterojunction.

Another object of the present invention is to provide a compound semiconductor field effect transistor, comprising:
- a channel layer of undoped first compound semiconductor material having a first bandgap;
- a gate region provided on a first region defined on a major surface of said channel layer and laterally bounded by first and second, mutually opposing side walls, said gate region comprising a second compound semiconductor material of the p-type and having a second bandgap substantially larger than said first bandgap;
- a source region provided on said major surface of said channel layer in correspondence to a second region defined at one side of said first region, said source region being bounded by a third side wall and comprising a third compound semiconductor material of the p-type;
- a drain region provided on said major surface of said channel layer in correspondence to a third region defined at the other side of said first region with respect to said second region, said drain region being bounded by a fourth side wall and comprising a fourth compound semiconductor material of the p-type;
- a gate electrode provided on said gate region in Schottky contact therewith;
- a source electrode provided on said source region in ohmic contact therewith;
- a drain electrode provided on said drain region in ohmic contact therewith; and
- a two-dimensional hole gas formed in said channel layer along said major surface;
- said source region injecting holes into said two-dimensional hole gas at said first region across said major surface;
- said drain region collecting holes from said two-dimensional hole gas at said second region across said major surface;
- said third side wall comprising a crystal surface that contacts with said first side wall at an interface between said source region and said major surface of said channel layer, said crystal surface being inclined so as to separate from said first side wall at a level above said interface;
- said fourth side wall comprising a crystal surface that contacts with said second side wall at an interface between said drain region and said major surface of said channel layer, said crystal surface being inclined so as to separate from said second side wall at a level above said interface;
- wherein said channel layer carries, on said major surface thereof, a layer containing a p-type dopant with a concentration level higher than any of said source and drain regions, in correspondence to each of said first and second regions.

According to the present invention, it is possible to improve the operational speed of a HEMT that employs a two-dimensional hole gas for the carrier, by minimizing the resistance of the current path through the device. Such a HEMT can be used for constructing a complementary HEMT by combining with an ordinary HEMT that uses a two-dimensional electron gas as the carrier.

Another object of the present invention is to provide a heterobipolar transistor, comprising:
- a collector contact layer of an n-type compound semiconductor material, said collector contact layer having a major surface;
- a collector electrode provided on a first region of said major surface of said collector contact layer;
- a collector layer of a compound semiconductor material provided on a second, different region of said major surface of said collector contact layer;
- a base layer of a p-type compound semiconductor material provided on said collector layer;
- a base contact layer of a p-type compound semiconductor material provided on a major surface of said base layer in correspondence to a third region defined thereon, said base contact layer being bounded by a first side wall;
- a base electrode provided on said base contact layer;
- an emitter layer of an n-type compound semiconductor material provided on said major surface of said base layer in correspondence to a fourth region defined thereon adjacent to said third region, said emitter layer being bounded by a second side wall facing said first side wall; and
- an emitter electrode provided on said emitter layer;
- said compound semiconductor material forming said emitter layer having a bandgap substantially larger than a bandgap of said compound semiconductor material that forms said base layer;
- said first side wall comprising a crystal surface inclined with respect to said major surface of said base layer such that said first side wall contacts with said second side wall at said major surface of said base layer and separates from said second side wall at a level above said major surface of said base layer;
- said base layer carrying on said upper major surface a layer of p-type dopant in correspondence to said third region, with a concentration level higher than any of said base layer and said base contact layer.

According to the present invention, it is possible to construct a high speed NPN heterobipolar transistor that includes a base contact layer formed on a thin base layer adjacent to the emitter layer. As the base contact layer is formed by a regrowth of a crystal region such that the base contact layer is laterally bounded by a crystal surface, the base electrode on the base contact layer is effectively separated from the emitter electrode on the emitter region while minimizing the distance between the emitter electrode and the base electrode. Further, the operational speed of the device is maximized by using the base layer having an extremely small thickness. Thereby, the resistance at the interface between the base layer and the base contact layer is minimized by removing adversary impurities and further providing a planar doping to such an interface.

Other objects and further features of the present invention will become apparent from the following detailed description when read in conjunction with the attache drawings.

DETAILED DESCRIPTION OF THE PREFERRED EMBODIMENTS

[first embodiment]

Figure 6:
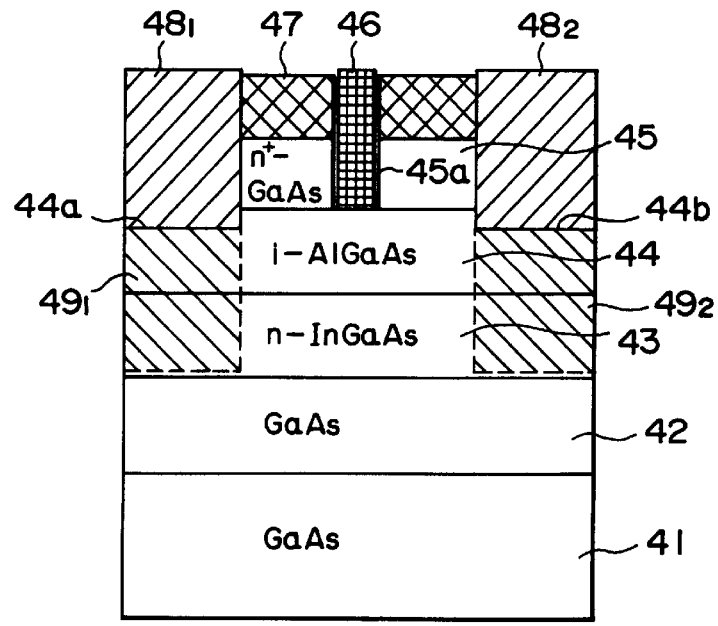
FIG. 6 is a diagram showing the construction of a DMT according to a first embodiment of the present invention.

FIG. 6 shows the construction of a DMT according to a first embodiment of the present invention.

Referring to FIG. 6, the DMT is constructed upon a semi-insulating GaAs substrate 41 and includes a buffer layer 42 of undoped GaAs provided on the substrate 41, a channel layer 43 of n-type InGaAs provided on the buffer layer 42, and a barrier layer 44 of undoped AlGaAs provided also on the channel layer 43. Typically, the channel layer 43 has a thickness of 14 nm and is doped by Si with a donor concentration level of $5 \times 10^{18} cm^{-3}$, while the barrier layer 44 has a thickness of 50 nm and a composition of $Al_{0.5}Ga_{0.5}As$. Further, a cap layer 45 of $n^+$-type GaAs is provided on the barrier layer 44, with a contact window 45a formed in correspondence to a channel region defined in the channel layer 43. The contact window 45a thereby exposes the barrier layer 44. It should be noted that one may use undoped GaAs for the cap layer 45 for minimizing the unwanted leak current.

The cap layer 45 has a thickness of 50 nm and is doped by Si with a donor concentration level of $2 \times 10^{18} cm^{-3}$. Further, a gate electrode 46 is provided on the exposed surface of the barrier layer 44 in Schottky contact therewith. As the gate electrode 46 is provided on the barrier layer 44 having a large bandgap and corresponding large resistivity, the device is substantially immune to the problem of gate current leak, as in the case of other DMTs. Further, a SiON layer 47 is provided on the cap layer 45 so as to provide an insulative protection, wherein the SiON layer 47 is formed with a contact hole in alignment with the contact window 45a for accommodating the gate electrode 46.

In the structure of FIG. 6, it should be noted that the cap layer 45 is removed at both sides of the gate electrode 46 together with the SiON layer 47 thereon by an etching process to expose the barrier layer 44 at surface regions 44a and 44b, wherein the exposed surface regions 44a and 44b are formed at a level equal to or lower than the upper major surface of the barrier layer 44 on which the gate electrode 46 is provided but higher than the upper major surface of the channel layer 43. On the exposed surface regions 44a and 44b of the barrier layer 44, it will be noted that source and drain electrodes $48_1$ and $48_2$ are provided by depositing successively a AuGe alloy layer and a Au layer, followed by an alloying process conducted at 400° C. for 180 seconds. As a result of the alloying process, diffusion regions $49_1$ and $49_2$, each containing Au and Ge, are formed respectively in correspondence to the electrodes $48_1$ and $48_2$, such that the diffusion regions $49_1$ and $49_2$ penetrate into the barrier layer 44 and further into the channel layer 43.

In the present embodiment, the level of the foregoing surfaces 44a and 44b is preferably determined such that the surface depletion regions (not shown) associated with the surfaces 44a and 44b do not cause a complete depletion in the channel layer 43 in the state that the source and drain electrodes $48_1$ and $48_2$ are provided, and such that metal elements such as Au and Ge forming the diffusion regions $49_1$ and $49_2$ successfully reach the channel layer 43 with a substantial concentration level, for example with a concentration level exceeding $1.0 \times 10^{21} cm^{-3}$ for Ge. Thereby, one can substantially reduce the parasitic resistance of the source and drain electrodes $48_1$ and $48_2$ and hence the resistance of the current path extending through the channel layer 43 between the source and drain electrodes $48_1$ and $48_2$. As the exposed surfaces 44a and 44b are located above the upper major surface of the channel layer 43, the channel layer 43 experiences no damage at all even when an etching process is applied to form the foregoing surface regions 44a and 44b.

Figure 3:
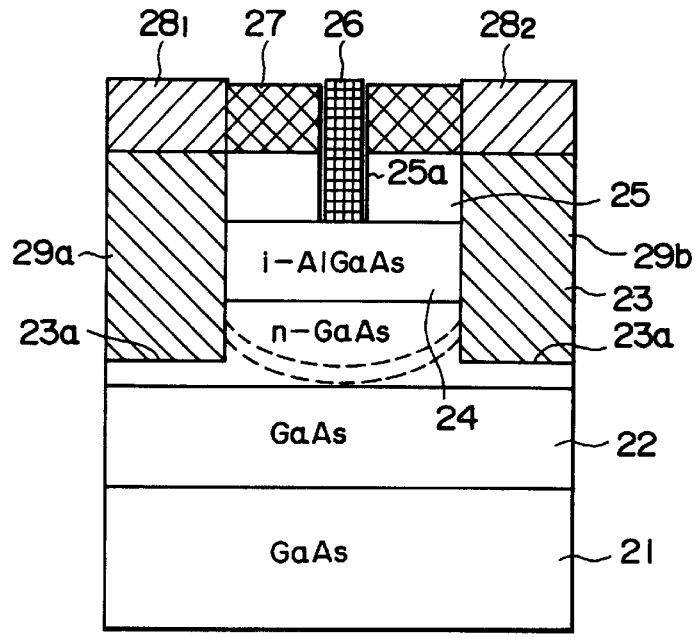
FIG. 3 is a diagram showing the construction of another conventional DMT.
Figure 7A:
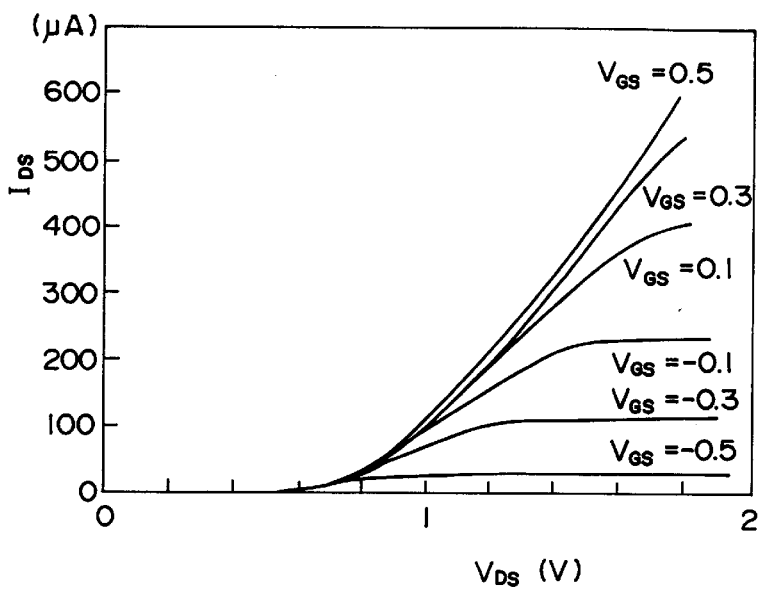
FIGS. 7A and 7B are diagrams comparing the operational characteristics of the device of FIG. 6 with a conventional device.
Figure 7B:
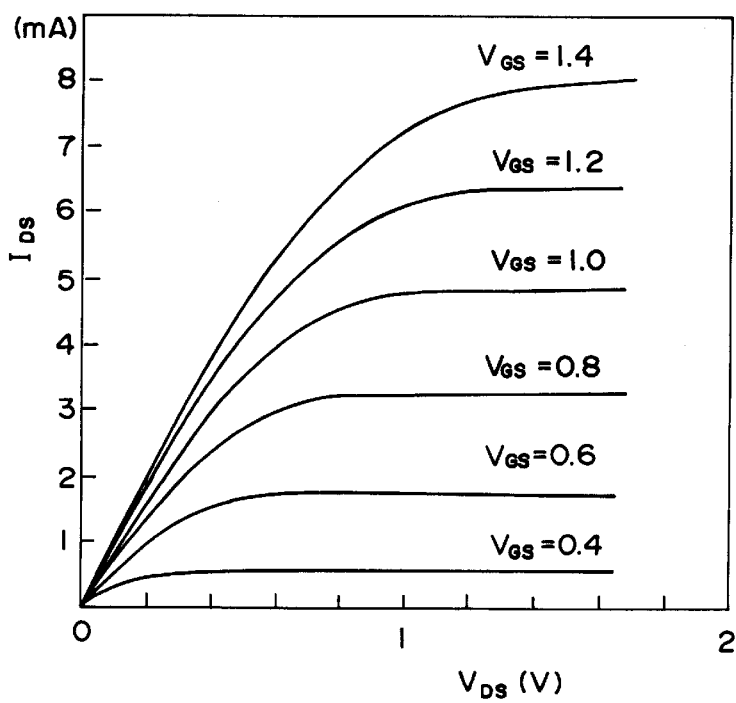

FIGS. 7A and 7B compares the static characteristic diagram of the DMT of FIG. 3 with the corresponding static characteristic diagram of the DMT of the present embodiment, wherein each of FIGS. 7A and 7B shows a drain current $I_{DS}$ as a function of a drain-source voltage $V_{DS}$ for various gate voltages $V_{GS}$.

Figure 2:
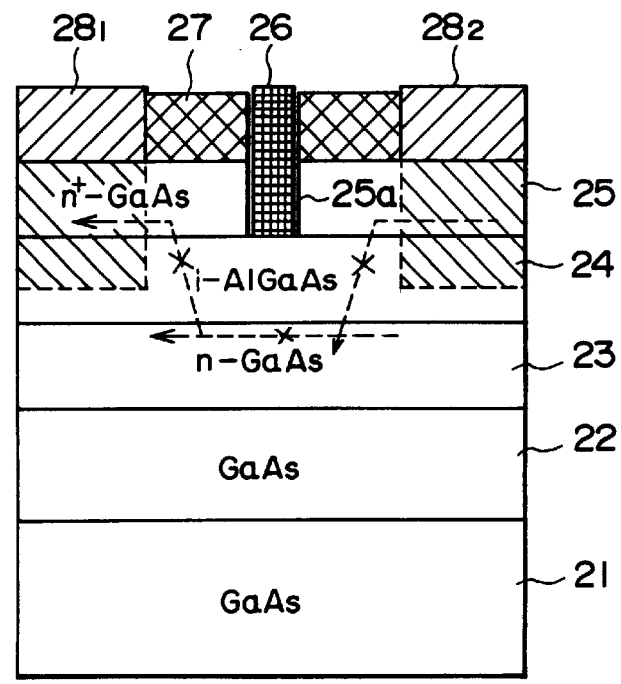
FIG. 2 is a diagram showing the construction of a conventional DMT.

As will be noted in FIG. 7A, the drain current $I_{DS}$ is not observed in the device of FIG. 3 when the source-drain voltage $V_{DS}$ is smaller than about 0.5 V, while in the device of the present embodiment, the drain current $I_{DS}$ starts to flow immediately a source-drain voltage $V_{DS}$ is applied. Further, the relationship of FIG. 7B shows a superior linearity in the region where the source-drain voltage $V_{DS}$ is small. In other words, FIGS. 7A and 7B clearly indicates the small source-drain resistance of the DMT device of FIG. 6 over the DMT of FIG. 2. Further, it should be noted that the DMT of FIG. 2 shows a transconductance $g_m$ of only about 15 (mS/mm), while the DMT of FIG. 6 shows a $g_m$ of as much as 200 (mS/mm). In addition, the DMT of FIG. 6 shows a source resistance Rs of 2.0 Ωmm, which is a significant improvement over the device of FIG. 2 that shows the Rs of about 150 Ωmm.

[modification of first embodiment]

It should be noted that a concept of the device of FIG. 6 is applicable also to other type devices such as HEMT or MESFET.

Figure 1:
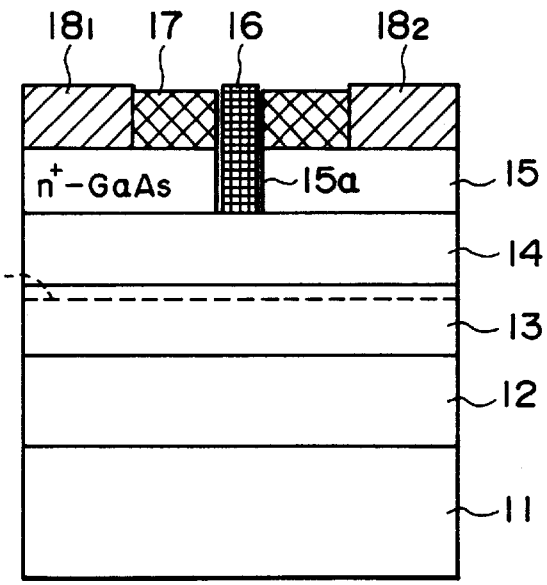
FIG. 1 is a diagram showing the construction of a conventional HEMT.
Figure 8:
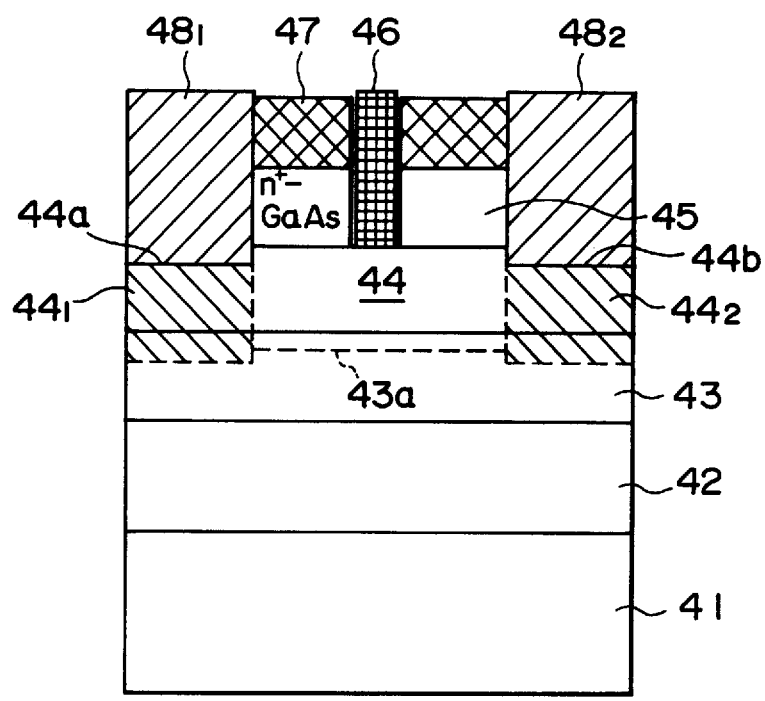
FIG. 8 is a diagram showing a modification of the first embodiment.

FIG. 8 shows an example of a HEMT having a structure similar to that of the DMT of FIG. 6 as a modification of the present embodiment. In FIG. 8, those parts corresponding to the HEMT of FIG. 1 are designated by the same reference numerals and the description thereof will be omitted.

Referring to FIG. 8, the cap layer 15 of the HEMT is recessed at both sides of the gate electrode 16 to form exposed surface regions 14a and 14b on the electron supplying layer 14, wherein the surface regions 14a and 14b are formed at a level equal to or lower than the level of the upper major surface of the layer 14 but higher than the level of the upper major surface of the channel layer 13. Further, the source and drain electrodes $18_1$ and $18_2$ are provided on the foregoing surface regions 14a and 14b. Thereby, diffusion regions $14_1$ and $14_2$ extend respectively from the source and drain electrodes $18_1$ and $18_2$ into the channel layer 13 and reach the two-dimensional electron gas 13a formed therein. Thereby, one can reduce the parasitic resistance of the source and drain electrodes $18_1$ and $18_2$ as well as the resistance of the current path through the device substantially.

[second embodiment]

Next, a second embodiment of the present invention will be described with reference to FIGS. 9A–9F showing a fabrication process of a HEMT that uses a two-dimensional hole gas as the carrier.

Figure 9A:
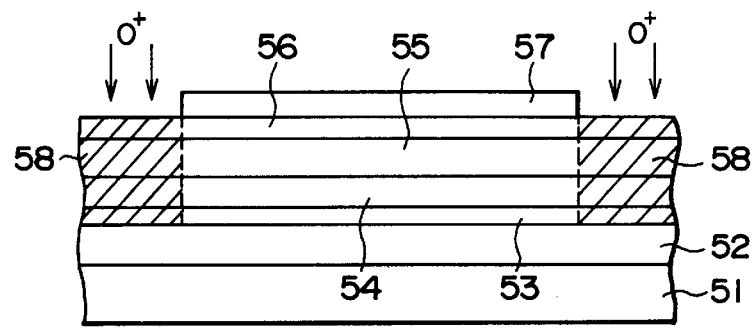
FIGS. 9A–9F are diagrams showing the fabrication process of a HEMT according to a second embodiment of the present invention.

Referring to FIG. 9A first, an undoped GaAs buffer layer 52 is deposited on a semi-insulating GaAs substrate 51 epitaxially with a thickness of about 500 nm, and a hole supplying layer 53 of p-type GaAs having a hole concentration level of $5 \times 10^{18} \text{cm}^{-3}$ is grown on the buffer layer 52 epitaxially with a thickness of 4 nm. Further, a channel layer 54 of undoped InGaAs having a composition of $\text{In}_{0.2}\text{Ga}_{0.8}\text{As}$ is grown epitaxially on the hole supplying layer 53 with a thickness of 14 nm. The channel layer 54, in turn, is covered by a barrier layer 55 of undoped AlGaAs having a composition of $\text{Al}_{0.75}\text{Ga}_{0.25}\text{As}$, wherein the barrier layer 55 is provided with a thickness of 25 nm. On the barrier layer 55, a cap layer 56 of undoped GaAs is provided epitaxially with a thickness of 5 nm. In such a structure, it should be noted that the hole supplying layer 53 of p-type GaAs supplies holes to the undoped channel layer 54 of InGaAs, and a two-dimensional hole gas is formed in the channel layer 54 along the interface between the channel layer 54 and the underlying hole supplying layer 53.

After the epitaxial layered semiconductor body is thus formed, a resist layer is provided on the cap layer 56, followed by a photolithographic patterning process of the same to form a resist pattern 57, such that the resist pattern 57 covers the active region of the device. Further, while using the resist pattern 57 as a mask, an ion implantation of oxygen ions ($\text{O}^+$) is conducted into the exposed part of the layered semiconductor body with such an energy that the implanted oxygen ions reach the channel layer 53 to form a device isolation region 58. Typically, the ion implantation is conducted under an acceleration voltage of 100 keV with a dose of $10^{12}\text{cm}^{-2}$.

Figure 9B:
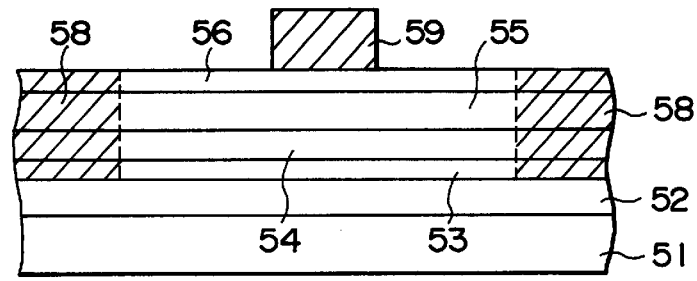

Next, in the step of FIG. 9B, a conductive layer of WSi is deposited on the uppermost layer 56 by a sputtering process with a thickness of about 400 nm, followed by a photolithographic patterning process to form a gate electrode 59 of WSi. Of course, the gate electrode 59 may be formed by other suitable Schottky material such as TiW. As a result, a structure shown in FIG. 9B is obtained.

Figure 9C:
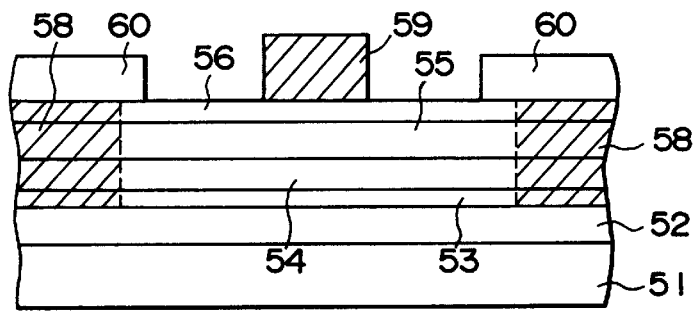

Further, in the step of FIG. 9C, a SiON film is deposited on the structure of FIG. 9B, followed by a photolithographic patterning process to form a SiON pattern 60 such that the SiON pattern exposes a region on which source and drain regions are to be formed.

Figure 9D:
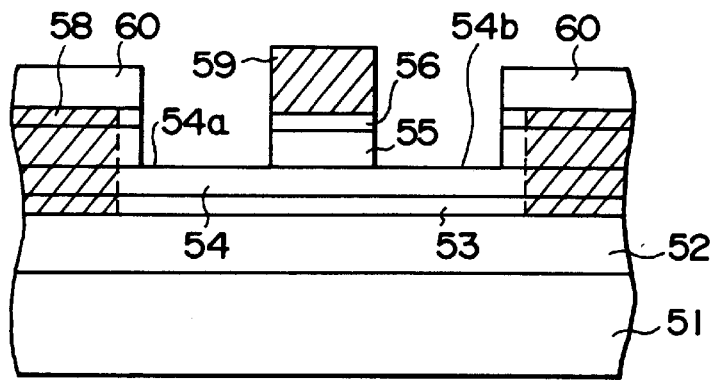

Next, in the step of FIG. 9D, a dry etching process is conducted upon the exposed region of the layered body while using $\text{SiCl}_4$ as an etching gas, such that the GaAs cap layer 56 and the AlGaAs barrier layer 55 are removed consecutively as a result of the dry etching process. When the upper major surface of the channel layer 54 is exposed, on the other hand, the dry etching stops spontaneously due to the very low vapor pressure of In-containing gaseous product compound that is produced as a result of the dry etching. In other words, the channel layer 54 that contains In therein is substantially immune to the dry etching process that acts effectively upon a III–V compound semiconductor layer free from In. As a result of such a selective dry etching, the upper major surface of the channel layer 54 is exposed substantially intact at surface regions 54a and 54b as indicated in FIG. 9D.

Figure 9E:
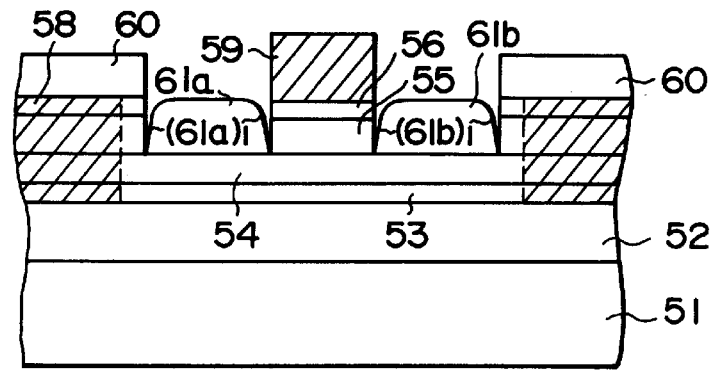

Next, in the step of FIG. 9E, source and drain regions 61a and 61b, both of p-type GaAs, are grown epitaxially on the exposed surface regions 54a and 54b, respectively, wherein the growth of the epitaxial regions 61a and 61b is conducted in a reaction chamber by a MOCVD process while supplying TMG (trimethylgallium) and TMAs (trimethylarsenic) into the reaction chamber in which the structure of FIG. 9D is held. As a result of such a MOCVD process, the regions 61a and 61b are formed with a thickness of about 30 nm. The regions 61a and 61b are thereby doped to the p-type by C contained in the TMAs, with a carrier concentration level of $10^{19}\text{cm}^{-3}$.

In the MOCVD process, it should be noted that the source and drain regions 61a and 61b thus grown form a single crystal region of GaAs and is defined by a crystal surface. Thus, the source region 61a is defined laterally by a pair of crystal surfaces $(61a)_1$ that are inclined with respect to the upper major surface of the channel layer 54 and forms a trapezoid having a top surface area substantially smaller than a base surface area. Similarly, the drain region 61b is defined laterally by a pair of crystal surfaces $(61b)_1$ that are inclined with respect to the upper major surface of the channel layer 54 and forms a similar trapezoid as in the case of the region 61a.

After the source and drain regions 61a and 61b are thus formed, a resist layer (not shown) is deposited on the structure of FIG. 9E, followed by a patterning process to form contact holes therein respectively in correspondence to the source and drain regions 61a and 61b. Further, an AuZn alloy layer and an Au layer are deposited consecutively upon the resist layer thus formed with the contact holes, with respective thicknesses of 50 nm and 200 nm. After lifting off the resist layer, one obtains a structure shown in FIG. 9F in which source and drain electrodes 62 and 63 are formed respectively on the source and drain regions 61a and 61b. The structure of FIG. 9F is further subjected to an alloying process conducted at 400° C. for 5 minutes in a nitrogen or other inert atmosphere, such that the source and drain electrodes 62 and 63 form an alloying with the underlying source and drain regions 61a and 61b.

Figure 9F:
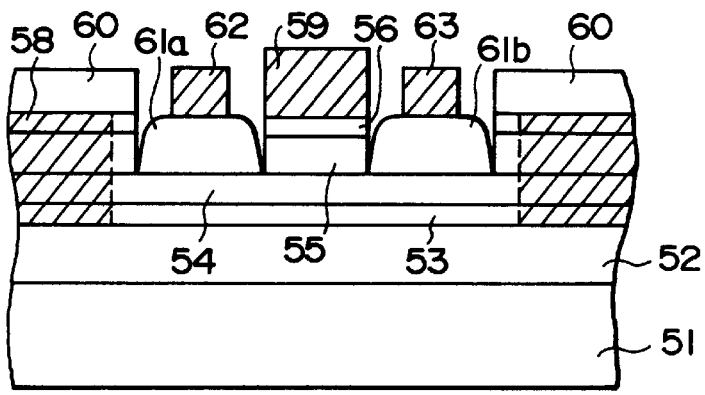

In the structure of FIG. 9F, it will be noted that the source and drain electrodes 62 and 63 do not contact with the gate electrode 59, as the source and drain regions 61a and 61b form a trapezoid defined by inclined side walls $(61a)_1$ or $(61b)_1$, while the source and drain regions 61a and 61b make a contact with the central barrier layer 55 at the base part thereof. Thereby, the problem of short circuit of the source and drain electrode is effectively avoided while simultaneously minimizing the separation between the source an drain regions of the device.

In operation, the holes are injected to the channel layer 54 from the source region 61a across the surface region 54a that is substantially coincident to the upper major surface of the channel layer 54, while the holes thus injected are recovered, after traveling through the two-dimensional hole gas in the channel layer 54, by the drain region 61b as well as by the drain electrode 63 provided thereon, upon crossing the surface region 54b that is also coincident to the upper major surface of the channel layer 54. As the HEMT of the present embodiment includes the barrier layer 55 under the gate electrode 59, the device is substantially free from leak of gate current.

Table I below compares the source resistance Rs and the transconductance $g_m$ of the device of FIG. 9F with those of a conventional recessed type device in which the source and drain electrodes are provided on the cap layer similarly to the HEMT of FIG. 1 as well as with a conventional regrowth device in which source and drain regions are provided at both lateral sides of the channel layer similarly to the DMT of FIG. 4. In Table I, it should be noted that the comparison was made for a device structure having a gate length of 0.5 μm and a gate width of 10 μm.

TABLE I

|  | source resistance (Ωmm) | transconductance (mS/mm) |
| --- | --- | --- |
| present invention | 0.5 | 148 |
| conventional recess | 8 | 70 |
| conventional regrowth | 12 | 50 |

As will be noted from Table I, the device of the present embodiment provides a source resistance Rs of only 0.5 Ωmm that is significantly smaller over any other conventional devices. Further, the transconductance $g_m$ of the device is much larger than any other conventional devices in spite of the use of the barrier layer of a large bandgap.

Table II below shows, on the other hand, a drain leak current observed for various devices shown in Table I, together with a corresponding drain current, wherein the measurement was made while applying a drain voltage of 1 V.

TABLE II

|  | drive current (1V) (mA/mm) | drain leak current (1 V drain voltage) |
| --- | --- | --- |
| present invention | 64 | 50 nA/mm |
| conventional recess | 30 | 50 nA/mm |
| conventional regrowth | 21 | 50 mA/mm |

It should be noted that the drain leak current of Table II indicates the leak current at the pinch-off of the transistor and represents the degree of the short channel effect. Thus, the very small drain leak current as demonstrated in Table II for the device of the present invention indicates that the short channel effect is successfully suppressed in the HEMT of the present embodiment. As demonstrated by the large drive current at small supply voltage of only 1 V, the p-channel device of the present embodiment provides a high operational speed that is suitable for use in combination with a n-channel device to construct a high speed complementary compound semiconductor device.

In the present embodiment, the material of the channel layer 54 acting also as the etching stopper is not limited to InGaAs but other materials such as InGaAsP or InGaP may also be used. Further, one may use InP for the substrate 51 in place of GaAs. The barrier layer 55, in turn, may be formed of GaAsSb or AlGaAsSb.

[modification of the second embodiment]

Figure 10:
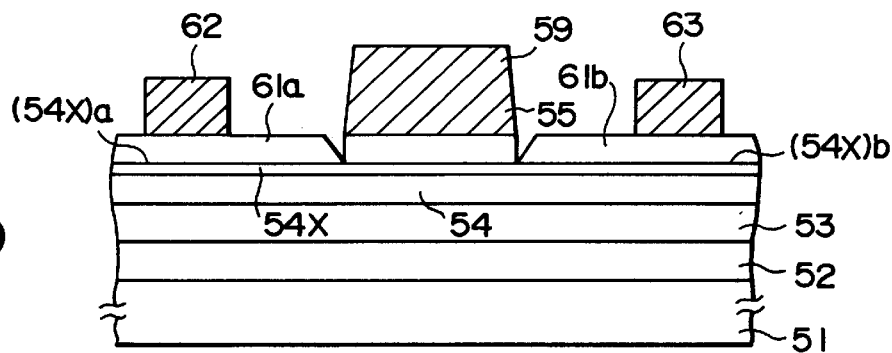
FIG. 10 is a diagram showing a modification of the second embodiment.

FIG. 10 shows a modification of the second embodiment of the present invention, wherein those parts corresponding to the parts described previously are designated by the same reference numerals and the description thereof will be omitted.

In the modification of FIG. 10, it should be noted that the channel layer 53 is formed of undoped GaAs as generally practiced in the art of HEMT, and there is provided an etching stopper layer 54x of InGaAs on the channel layer 53 such that the barrier layer 55 is provided not in contact with the channel layer 54 but in contact with the etching stopper layer 54x. Further, the source and drain regions 61a and 61b of p-type GaAs are grown upon surface regions $(54x)_a$ and $(54x)_b$ defined on the etching stopper layer 54x in correspondence to the surfaces 54a and 54b of the previous embodiment as a result of the regrowth process.

According to the present embodiment, one can use any suitable material for the channel layer 54 while protecting the same from substantial etching at the time of exposing the surface regions $(54x)_a$ and $(54x)_b$, and the fabrication of the device is substantially simplified. As InGaAs has a small bandgap, the etching stopper layer 54x does not provide substantial resistance to the carriers injected and recovered by the source and drain regions 61a and 61b. It is also possible to remove the etching stopper 54x after the foregoing surface regions $(54x)_a$ and $(54x)_b$ are exposed by a suitable selective etching process that acts selectively upon the InGaAs etching stopper layer 54x, such that the source and drain resistance is reduced further. In this case, the source and drain regions 61a and 61b are grown directly upon the channel layer 54 and the etching stopper layer 54x remains only under the barrier layer 55.

[another modification of the second embodiment]

Figure 11:
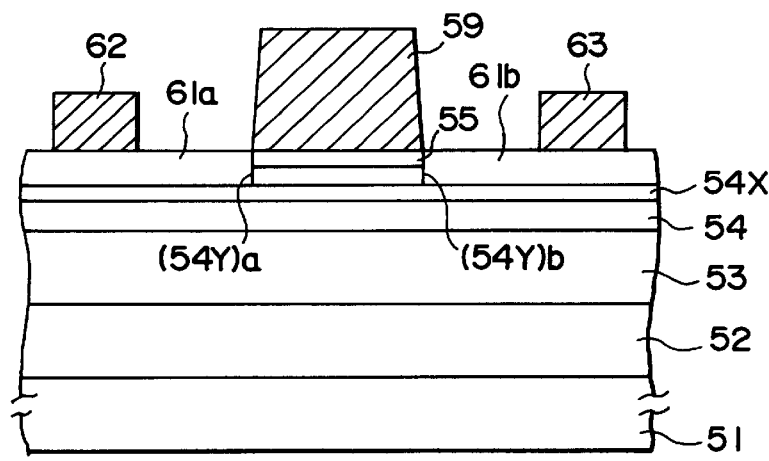
FIG. 11 is a diagram showing a further modification of the second embodiment.

FIG. 11 shows a further modification of the HEMT of the previous embodiment, wherein those parts described previously are designated by the same reference numerals and the description thereof will be omitted.

Referring to FIG. 11, it will be noted that the device is a modification of the embodiment of FIG. 10 and includes a second channel layer 54y provided on the etching stopper layer 54x in correspondence to the channel region, such that the second channel layer 54y is covered by the barrier layer 55 and laterally defined by side walls $(54y)_a$ and $(54y)_b$, wherein the source and drain regions 61a and 61b make a contact with the second channel layer 54y at the respective side walls $(54y)_a$ and $(54y)_b$. By suitably controlling the condition of the MOCVD process, it is possible to grow the source and drain regions 61a and 61b in intimate contact with the side walls $(54y)_a$ and $(54y)_b$ respectively. In the present modification, too, it is possible to eliminate the etching stopper layer 54x from the region on which the source and drain regions 61a and 61b are formed by the regrowth process.

[third embodiment]

Next, a third embodiment of the present invention will be described.

Before going into the description of the present embodiment, the experiments conducted by the inventor of the present invention and providing the principle of the present invention, will be explained briefly with reference to FIGS. 12–16.

Figure 12:
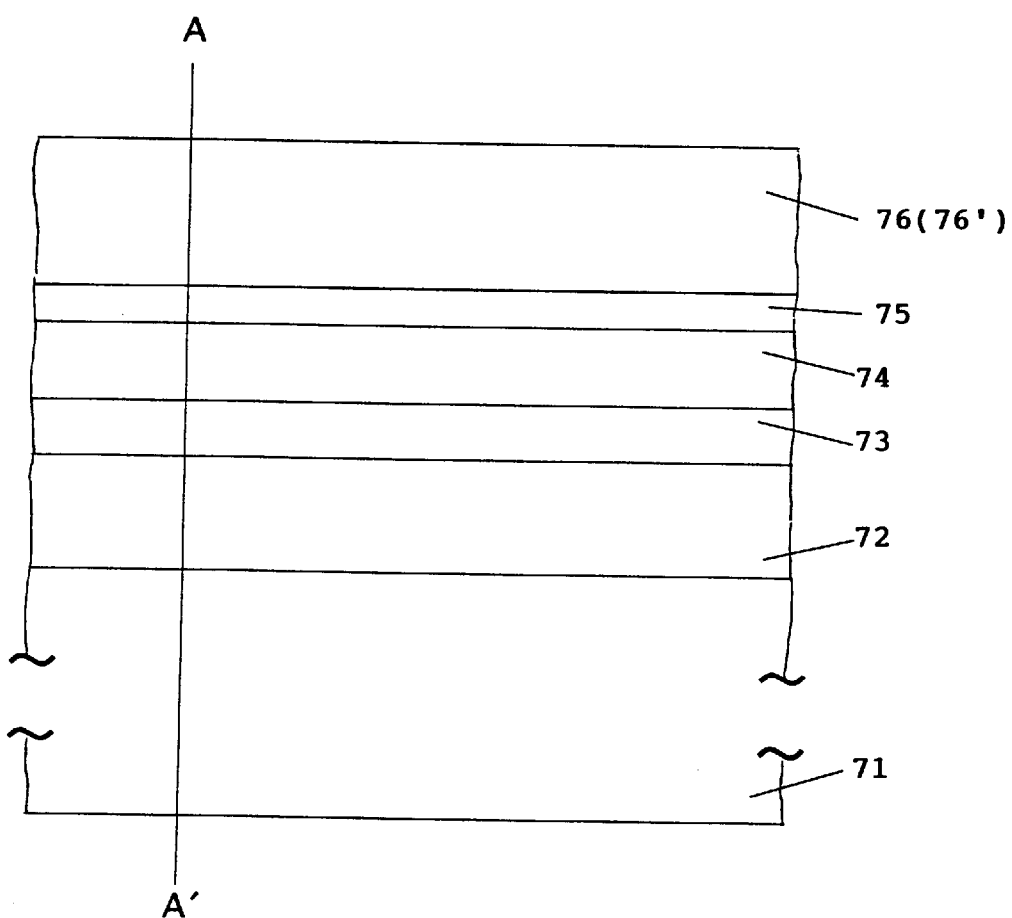
FIG. 12 is a diagram showing the construction of a layered semiconductor body used as a test piece in the experiment that forms the basis of a third embodiment of the present invention.

Referring to FIG. 12 showing the construction of a layered semiconductor body 70 used in the experiment, the layered semiconductor body 70 is constructed upon a semi-insulating GaAs substrate 71 and includes an undoped buffer layer 72 formed on the substrate 71 with a thickness of about 600 nm. On the buffer layer 72, there is provided an undoped AlGaAs layer 73 having a thickness of 50–100 nm, and a p-type GaAs layer 74 is provided on the layer 73 with a thickness of about 100 nm. Further, an undoped InGaAs layer 75 is provided on the foregoing GaAs layer 74 with a thickness of 14 nm, and a p-type GaAs layer 76 is provided on the layer 75 with a thickness of about 150 nm. Thereby, the layers 72–76 are grown consecutively by a normal MOCVD process conducted under a pressure of 76 Torr and at a temperature of 650° C., while supplying TMG (trimethylgallium), TEG (triethylgallium), TMI (trimethylindium) or TMA (trimethylaluminum) as the source of the group III element and arsine ($AsH_3$) as the source of the group V element. The deposition was made on a surface of the GaAs substrate 71 that forms an angle of about 2 degrees with respect to the (100) surface of GaAs.

After the layered semiconductor body 70 is thus formed, the layer 76 was removed selectively with respect to the underlying layer 75 by a dry etching process that uses $SiCl_4$ for the etching gas, until the upper major surface of the layer 75 is exposed. Further, a layer 76' having a composition identical to the composition of the layer 76 was grown on the exposed upper major surface of the layer 75 with a thickness substantially identical with the thickness of the original layer 76.

When growing the layer 76', an attempt was made to remove any impurities that are deposited on the exposed surface of the layer 75 such as O, Si, Cl or $CH_x$ by flushing a metal organic gaseous compound such as TMAs (trimethylarsenic) or TMSb (trimethylantimony), without causing any substantial growth of the layer 76'. Typically, the flushing was made with a flowrate of 100 sccm when TMAs is used. When TMSb is to be used, the flowrate was set to 50 sccm. It should be noted that TMAs or TMSb is an organic compound and contains C that acts as an acceptor when settled in the As site of a III–V compound semiconductor crystal. For example, it is known in the art that a GaAs crystal grown from TMG and TMAs shows a p-type conductivity. Similarly, a GaSb crystal grown by a MOCVD process of TMG and TMSb shows the p-type, when the MOCVD process is conducted at a high temperature.

Figure 13:
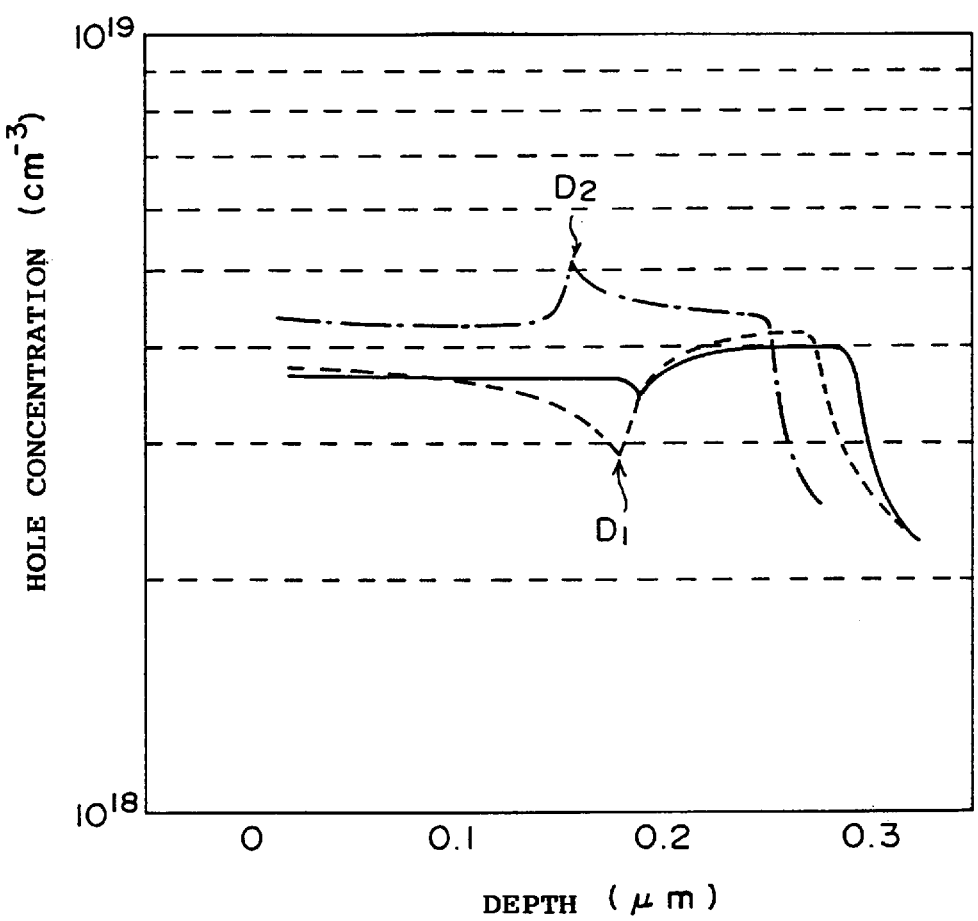
FIG. 13 is a diagram showing the carrier concentration profile realized in the structure of FIG. 12 for various processings including the present invention.

FIG. 13 shows the carrier concentration profile, more strictly the concentration profile of holes, in the layered structure of FIG. 12 along a line A–A'. It should be noted that the result of FIG. 13 was obtained by a polaron measurement. In FIG. 13, it will be noticed that the broken line represents the case where no particular processing was made upon the exposed surface of the InGaAs layer 75 before growing the layer 76', while the continuous line represents the result in which the exposed surface of the layer 75 was flushed by TMAs prior to the growth of the layer 76'. Further, the one-dotted line indicates the case in which the exposed surface of the layer 75 was flushed by TMSb before the growth of the layer 76'. In FIG. 13, it should be noted that the horizontal axis represents the depth measured from the surface of the layer 76.

Referring to FIG. 13, it will be noted that a substantial depletion of holes and hence carriers occurs at the interface between the InGaAs layer 75 and the p-type GaAs layer 76' thereon as indicated by $D_1$ as long as no surface processing is applied to the exposed surface of the InGaAs layer 75. On the other hand, such a depletion $D_1$ of the holes is successfully eliminated by flushing TMAs upon the exposed surface of the InGaAs layer 75. Further, FIG. 13 shows that the concentration of the holes may be even increased when the exposed surface of the layer 75 is treated by the flushing of TMSb, as clearly indicated by $D_2$.

The result of FIG. 13 indicates that p-type GaSb is formed in the layer 76' in the form of mixed crystal as a result of high temperature MOCVD of TMG and TMSb, and that such a formation of the GaSb mixed crystal causes the p-type doping in the interface between the InGaAs layer 75 and the regrowth layer 76'.

Summarizing the result of FIG. 13, it was indicated that the problem of carrier depletion caused by the impurities at the interface between the layer 75 and the regrowth layer 76' thereon is successfully eliminated by processing the exposed surface of the layer 75 by TMAs or TMSb prior to the deposition of the layer 76', and that it is even possible to reduce the resistance of the current path of a semiconductor device, which includes such a regrowth semiconductor layer, by processing the surface on which the regrowth is to be made, by TMSb such that acceptors are introduced selectively into such a surface.

Figure 14:
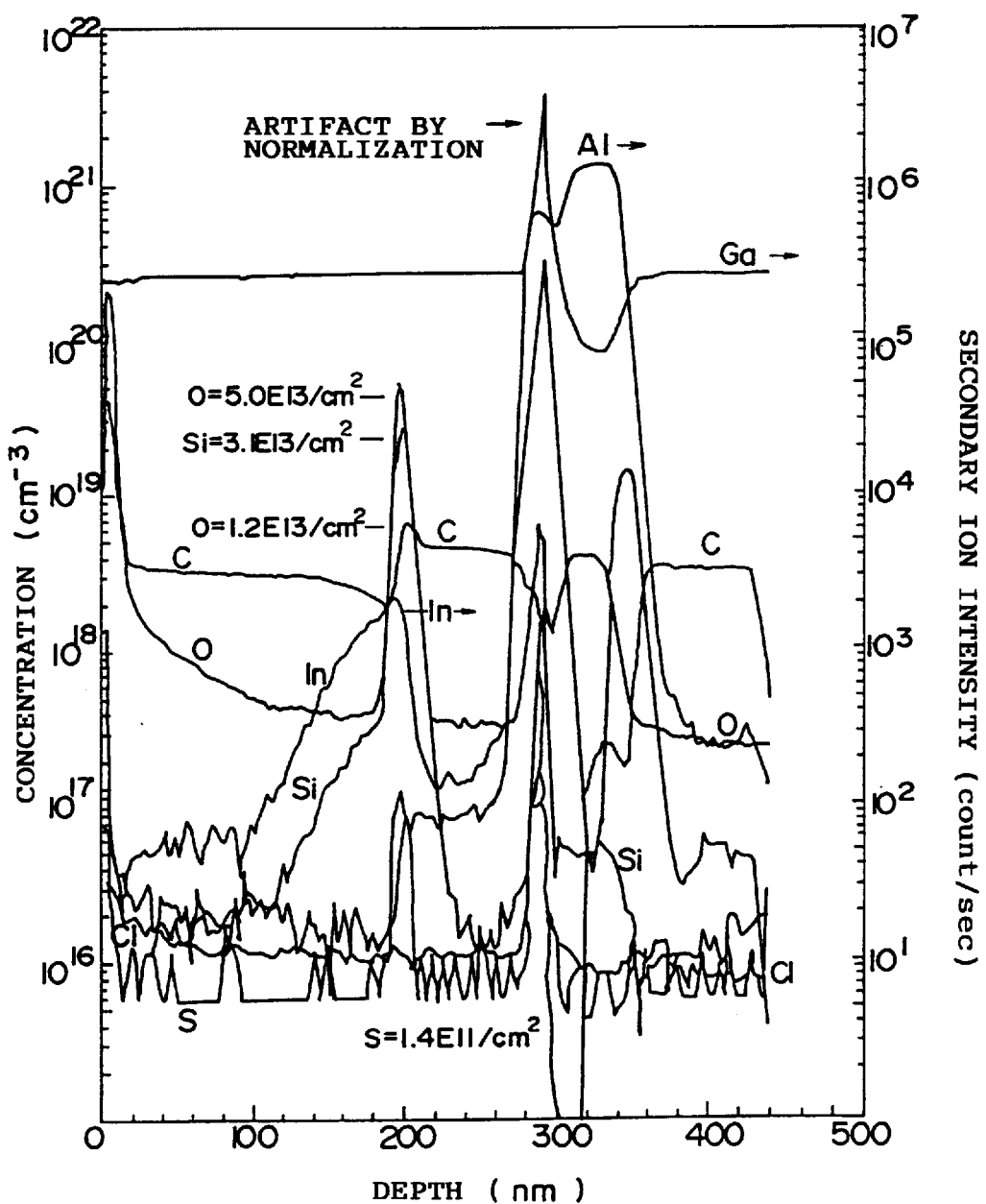
FIG. 14 is a diagram showing the concentration profile of various elements observed in the structure of FIG. 12 for the case the layered semiconductor body of FIG. 12 is formed by a conventional process.

FIG. 14 shows the result of SIMS analysis indicating the concentration profile of various elements in the layered semiconductor body 70 of FIG. 12, along the foregoing line A–A' for the case in which no particular processing was applied upon the exposed surface of InGaAs layer 75. In FIG. 14, it should be noted that the horizontal axis represents the depth from the surface of the layer 76' while the vertical axis at the left represents the concentration level of the detected elements. Further, the vertical axis as the right indicates the detected secondary ion intensity. Thus, the curves attached with a right arrow in FIG. 14 represent the secondary ion intensity, while other curves represent the detected concentration of the elements. Further, the values attached to the peak of various curves represent the sheet density of the element pertinent to the curve.

Referring to FIG. 14, it will be noted that the interface between the InGaAs layer 75 and the GaAs regrowth layer 76' is located at a depth of about 200 nm from the surface of the layer 76', wherein the InGaAs layer 75 is identified by the peak of In observed at the depth of about 200 nm. As will be noted, other elements such as O, Si, C also form respective peaks at the same depth, indicating that the upper major surface of the layer 75 is substantially contaminated by these elements. It is believed that O is introduced from the air when the exposed surface of the InGaAs layer 75 has contacted with the air, while the contamination by Si arises due to $SiCl_4$ that is used for the etching gas. Further, observed C represents the organic group $CH_x$ adsorbed on the exposed surface of the layer 75. On the other hand, the peaks observed at the depth of 300 nm are not a real peak but an artifact associated with normalization. Further, it should be noted that the peak of Al observed at the depth between 300 nm and 400 nm indicates the AlGaAs layer 73. Thereby, the region located between the foregoing Al peak and the In peak corresponds to the p-type GaAs layer 74.

Figure 15:
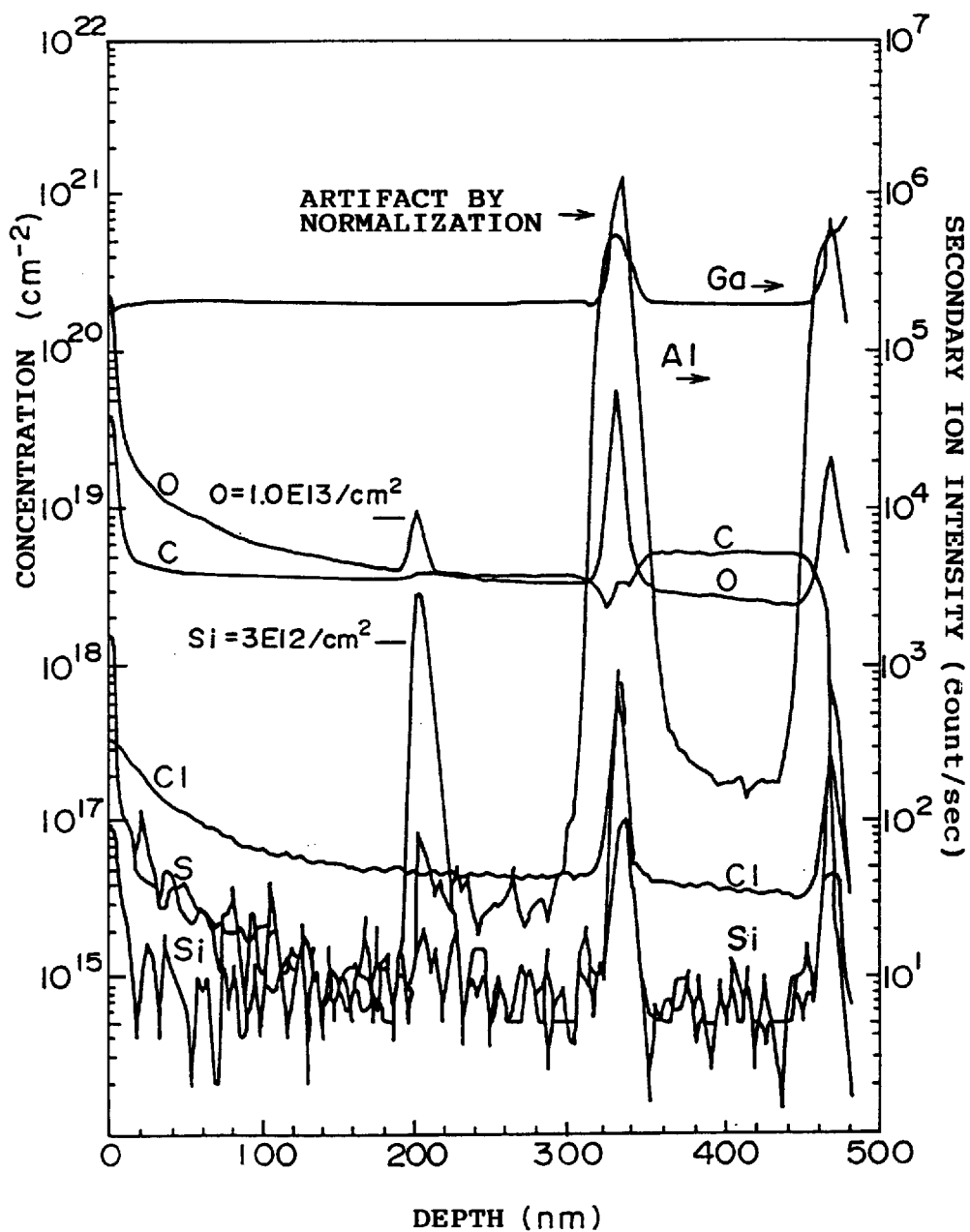
FIGS. 15 and 16 are diagrams showing the concentration profile of various elements in the structure of FIG. 12 for the case in which processings pertinent to the present invention are employed.

FIG. 15 shows an elemental distribution profile similar to FIG. 14 for the case in which the upper major surface of the layer 75 is flushed by TMAs prior to the growth of the layer 76'.

Referring to FIG. 15, it should be noted that the height of the oxygen peak indicative of the oxygen sheet density has reduced from $5.0\times10^{13}/cm^2$ of FIG. 14 to $1.0\times10^{13}/cm^2$, and the height of the Si peak indicative of the Si sheet density has reduced from $3.1\times10^{13}/cm^2$ of FIG. 14 to $3.3\times10^{12}/cm^2$. It will further be noted that the peak of C, which is recognized in FIG. 14, no longer appears in FIG. 15.

Figure 16:
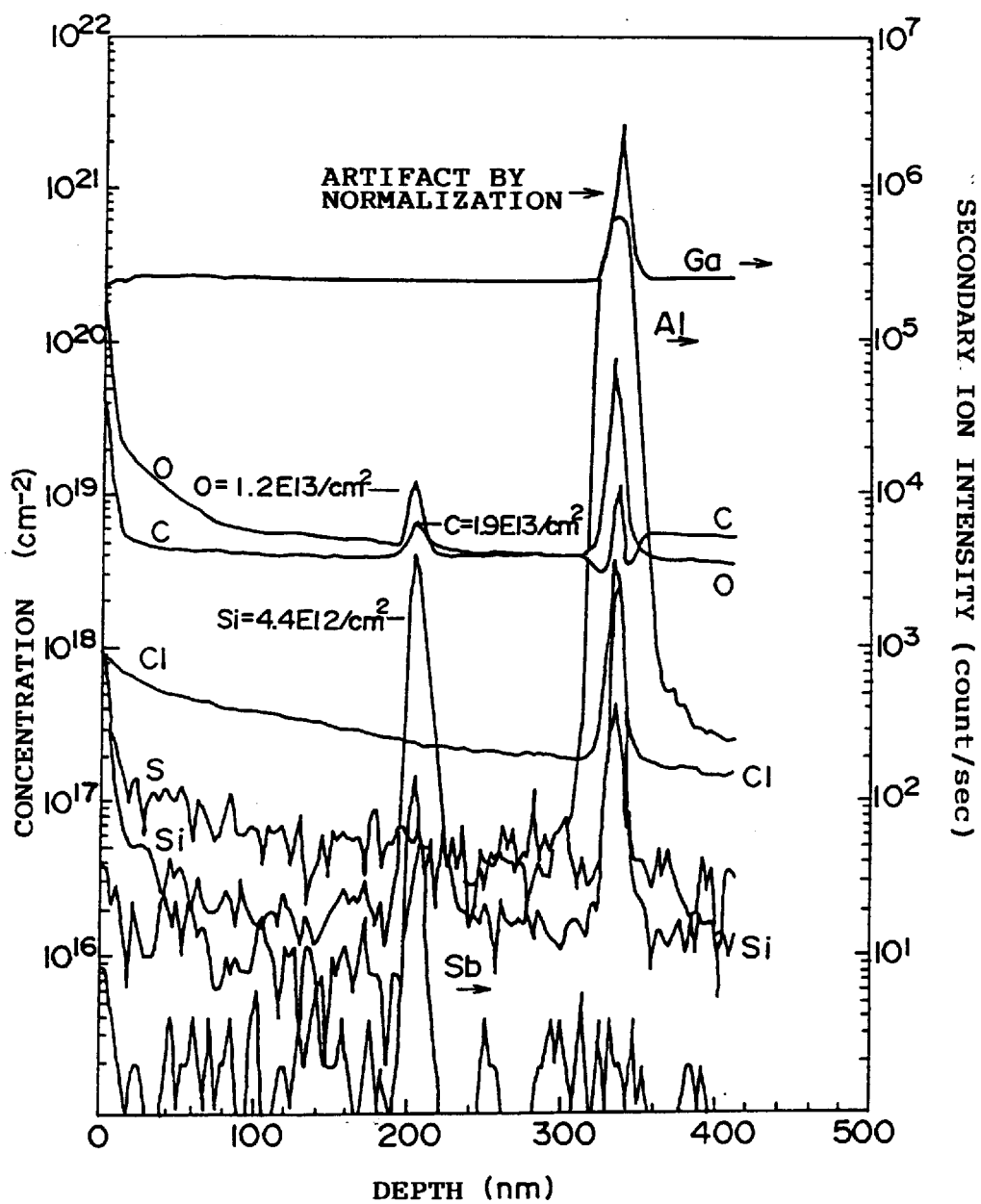

FIG. 16 shows a similar elemental distribution profile for the case in which the surface of the exposed InGaAs layer 75 is flushed by TMSb.

Referring to FIG. 16, it will be noted that the height of the oxygen peak has reduced to $1.2\times10^{13}/cm^2$ at the interface between the InGaAs layer 75 and the GaAs regrowth layer 76'. Similarly, the height of the Si peak has reduced to $4.4\times10^{12}/cm^2$, the height of C peak to $1.9\times10^{13}/cm^2$. In FIG. 16, it should be noted further that there appears a concentration of Sb at the depth of 200 nm in correspondence to the upper major surface of the layer 75.

As already explained, Sb, which is incorporated to the exposed upper major surface of the layer 75 in the high temperature MOCVD process in the form of TMSb, acts as a p-type dopant in the GaAs or InGaAs crystal, and increases the hole concentration level of the upper major surface of the layer 75. In other words, the profile of FIG. 16 guarantees a further increase of the hole concentration level. As a result of the increased hole concentration level, the resistance between the layer 75 and the layer 76' thereon decreases substantially. It was further observed that the effect of C as a p-type dopant is not significant in view of the result of FIG. 15 in which only TMAs, acting as a source of C, was flushed over the exposed surface of the layer 75.

Hereinafter, the fabrication process of a HEMT according to the present embodiment will be described with reference to FIGS. 17A–17D.

Figure 17A:
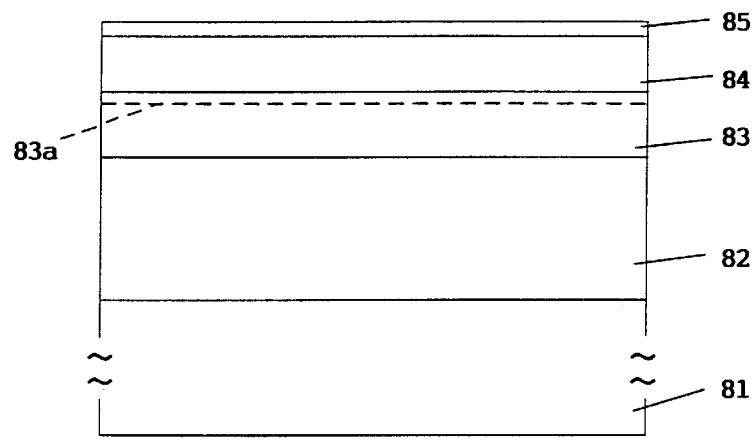
FIGS. 17A–17D are diagrams showing the fabrication process of a HEMT according to a third embodiment of the present invention.

Referring to the step of FIG. 17A, the HEMT is constructed upon a semi-insulating GaAs substrate 81 on which a buffer layer 82 of undoped GaAs is provided epitaxially with a thickness of 600 nm. On the buffer layer 82, a channel layer 83 of undoped InGaAs is provided epitaxially with a thickness of 14 nm, and a hole supplying layer 84 of p-type AlGaAs is provided further on the channel layer 83 epitaxially with a thickness of 30 nm. On the layer 84, an undoped GaAs layer 85 is provided epitaxially with a thickness of 10 nm for improving the breakdown characteristics of the device.

The deposition of the layers 82–85 is typically conducted by an MOCVD process. More specifically, the substrate 81 may be a wafer of 3 inch diameter and may have a principal surface inclined with respect to the (100) surface by 2°. The layers 82–85, in turn, are deposited consecutively by a low pressure MOCVD process while using TMG, TEG, TMI, TMA, and the like for the source of group III elements and arsine for the source of the group V element. When growing the p-type AlGaAs layer 84, on the other hand, a gaseous material such as TMAs or $CBr_4$ is supplied as a p-type dopant. The gaseous material thus supplied then experiences a decomposition in the vicinity of the substrate or semiconductor layer on which growth of a semiconductor layer is to be made, and there occurs a release of C atoms as a result of such a decomposition of the gaseous organic dopant. Upon settling of the C atoms thus released into the As site of the AlGaAs layer 84, holes are released from the C atoms and the holes thus released case a doping of the AlGaAs layer 84 to the p-type.

Figure 17B:
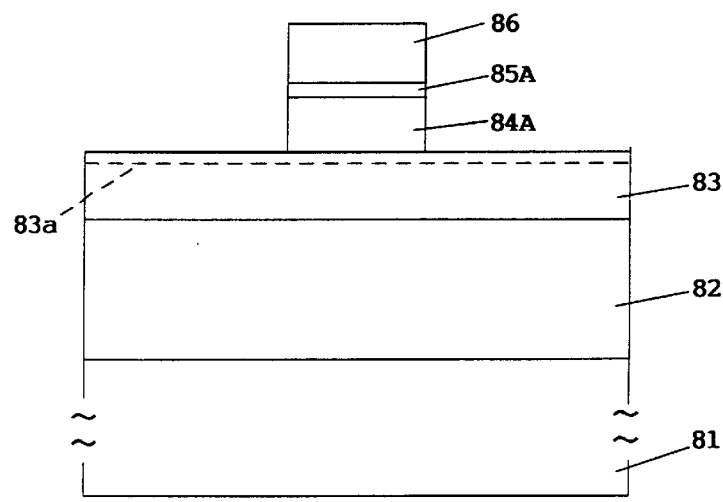

After forming the layered semiconductor body of FIG. 18A as such, a step of FIG. 17B is conducted in which a SiON mask 86 is provided on the layer 85, followed by a dry etching process of the layers 85 as well as the layer 74 underneath the layer 85, by using a $SiCl_4$ etching gas. The dry etching is conducted such that the layers 84 and 85 are removed and the upper major surface of the layer 83 is exposed, except for regions 84A and 85A that are protected by the mask 86.

Figure 17C:
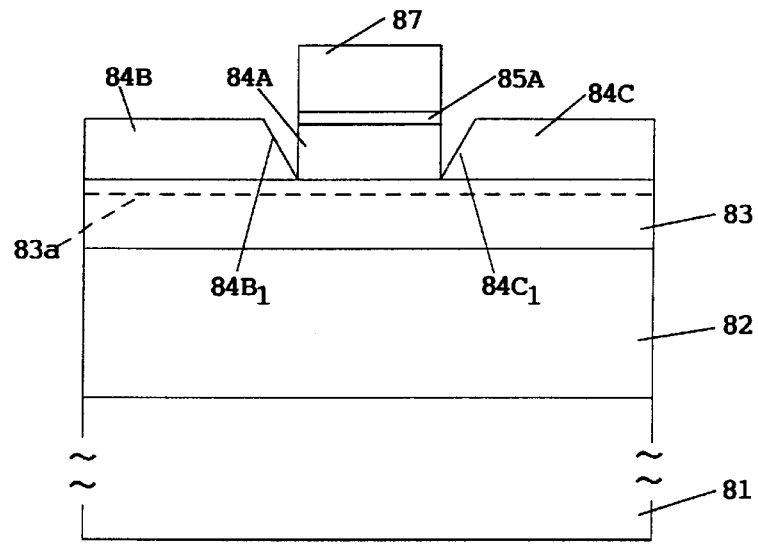

After the upper major surface of the layer 83 is thus exposed, regrowth of a p-type AlGaAs layer is made in a step of FIG. 17C upon the exposed upper major surface of the InGaAs layer 83, such that p-type AlGaAs regions 84B and 84C are formed at both sides of the region 84A with a thickness of 30 nm. In the step of FIG. 17C, it should be noted that the present embodiment includes a step of cleaning the exposed upper major surface of the layer 83 before the growth of the regions 84B and 84C is made, by flushing TMAs or TMSb while suppressing the supply of group III elements. As a result of flushing, the exposed upper major surface of the InGaAs layer 83 is cleaned and any impurities such as O, Si, Cl, $CH_x$ are effectively removed. When TMAs is used, the flushing is typically made by setting the flowrate of TMAs to 100 sccm. On the other hand, when TMSb is used, the flowrate of TMSb is set to 50 sccm.

Figure 17D:
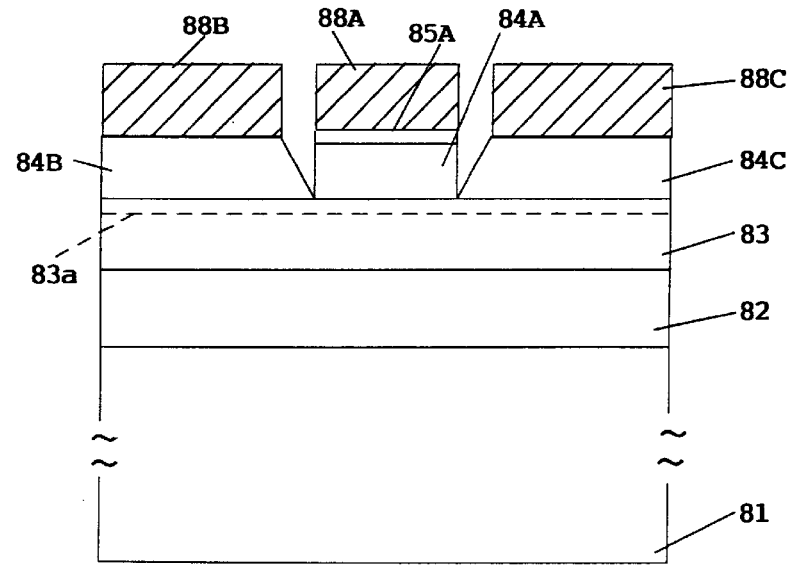

After the p-type AlGaAs regions 84B and 84C are grown as such, the SiON mask 87 is removed and ohmic electrodes 88B and 88C are formed respectively on the p-type regions 84B and 84C as source and drain electrodes. Further, a Schottky electrode 88A is formed on the exposed upper major surface of the layer 75A, as indicated in FIG. 17D.

In the present embodiment, it should be noted that crystal surfaces $84B_1$ and $84C_1$ develop extensively in the step of FIG. 17C, and the regions 84B and 84C show a trapezoidal elevational cross section as indicated in FIG. 17C, such that each of the regions 84B and 84C has a top surface substantially smaller than a base surface thereof. Thus, even when the p-type regions 84B and 84C are formed in contact with the region 84A at the base part thereof, the top surface is positively separated from the top surface of the region 84A, and short circuit of the source or drain electrode 88B or 88C with the gate electrode 88A is positively avoided while simultaneously minimizing the separation between the source region 84B and the drain region 84C. Thereby, the operational speed of the device is maximized even when the device is a HEMT that uses a two-dimensional hole gas as a carrier, by minimizing the distance between the source and drain regions 84B and 84C and further by minimizing the resistance at the interface between the source region 84B and the channel layer 83 or between the drain region 84C and the channel layer 83. The HEMT having such a construction can be used together with an ordinary HEMT that uses a two-dimensional electron gas as a carrier, to construct a complementary HEMT.

In the present embodiment, it should be noted that the gaseous material used for flushing the exposed upper major surface of the layer 83 is by no means limited to TMAs or TMSb but other organic gaseous source materials such as DMAs (dimethylarsenic) or TiPSb (triisopropylantimony) may also be used.

[fourth embodiment]

Figure 5:
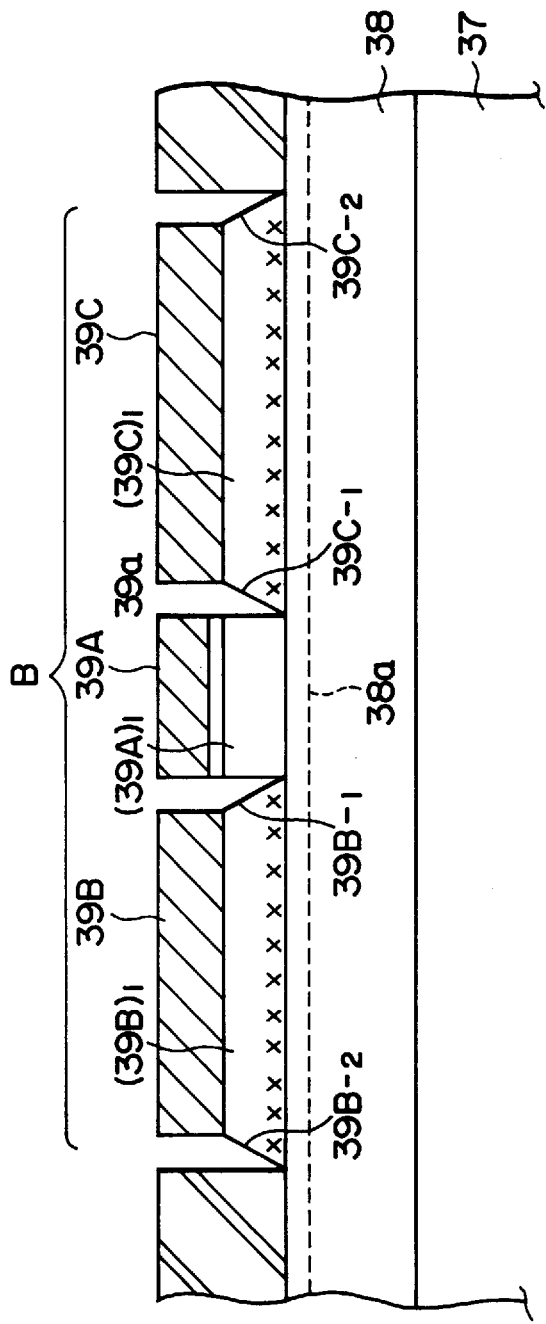
FIG. 5 is a diagram showing an improvement of the device of FIG. 4 in an enlarged scale.
Figure 18:
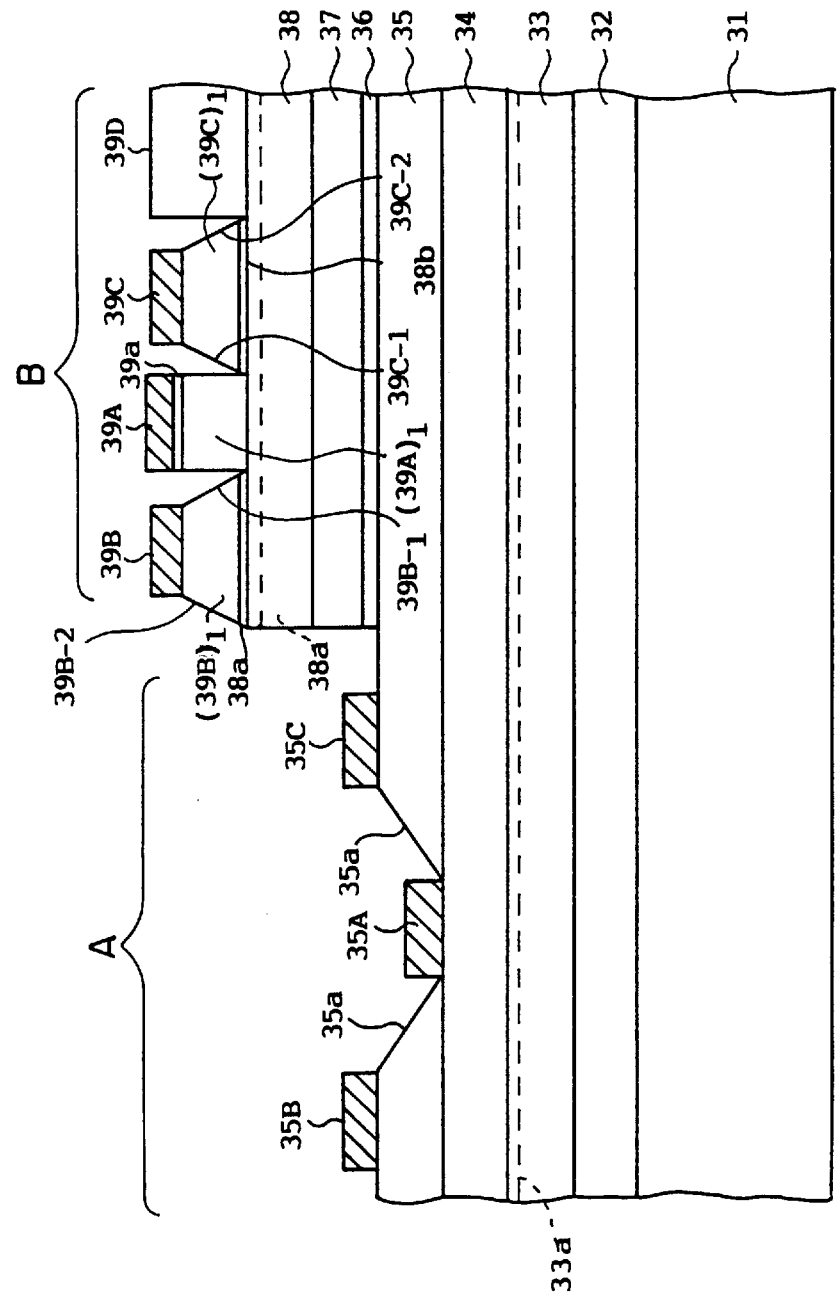
FIG. 18 is a diagram showing the construction of a complementary HEMT according to a fourth embodiment of the present invention.

FIG. 18 shows the construction of a complementary HEMT according to a fourth embodiment of the present invention. In FIG. 18, those parts corresponding to the part described previously with reference to the complementary HEMT of FIG. 5 are designated by the same reference numerals and the description thereof will be omitted.

Figure 4:
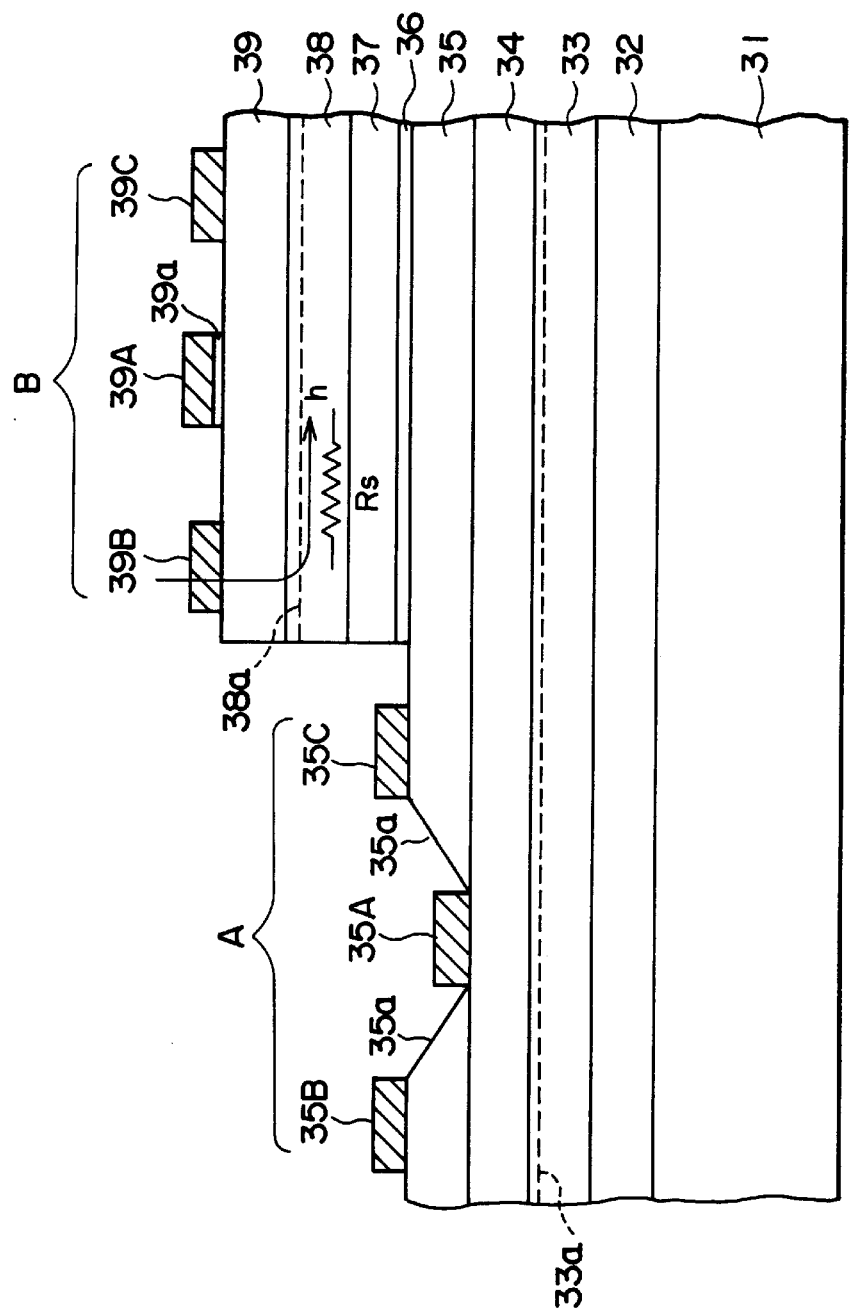
FIG. 4 is a diagram showing the construction of a conventional complementary HEMT.

Referring to FIG. 18, the regions $(39B)_1$ and $(39C)_1$ are grown on the channel layer 38 by a regrowth process similarly to the case of FIG. 4, and as a result, the regions 39A and 39B form a trapezoidal shape defined by the crystal surfaces $39B_{-1}$ and $39B_{-2}$ or crystal surfaces $39C_{-1}$ and $39C_{-2}$. Further, the exposed part of the surface of the layer 38 is covered by a SiON layer 39D.

In the present embodiment, the exposed surface of the channel layer 38 is flushed by an gaseous organic material such as TMAs, DMAs, TMSb or TiPSb prior to the growth of the crystal regions $(39B)_1$ and $(39C)_1$. Thereby, the organic compound containing Sb such as TMSb or TiPSb forms very thin layers 38a and 38b containing Sb on the upper major surface of the channel layer 38, respectively in correspondence to the crystal region $(39B)_1$ and the crystal region $(39B)_2$.

In the HEMT having such a construction, the distance between the gate region $(39A)_1$ and the source region $(39B)_1$, or the distance between the gate region $(39A)_1$ and the drain region $(39C)_1$, is minimized. Further, the contaminants such as O, Si or $CH_x$ are positively removed from the upper major surface of the channel layer 38 on which the source and drain regions $(39B)_1$ and $(39C)_1$ are grown. Thereby, the problem of increase of resistance at such an interface due to the depletion of carriers is effectively suppressed. Further, by forming the Sb-containing layers 38a and 38b at such an interface, it is possible to even increase the carrier concentration at such an interface. As already noted, the Sb dopants thus introduced form a p-type compound GaSb in the layers 38a and 38b in the form of mixed crystal.

As such, the HEMT formed in the region B of FIG. 18 operates with a speed comparable to that of the HEMT formed in the region A in spite of the disadvantageous feature of using a two-dimensional hole gas for the carriers. By combining such two types of HEMTs, it is possible to construct a very high speed complementary device having a very high operational speed and very low power consumption.

[fifth embodiment]

It should be noted that the fabrication process of the semiconductor device of the present invention that includes a regrowth process is not only effective for fabricating field effect transistors such as HEMT but also effective in fabricating other transistors such as HBT.

Figure 19:
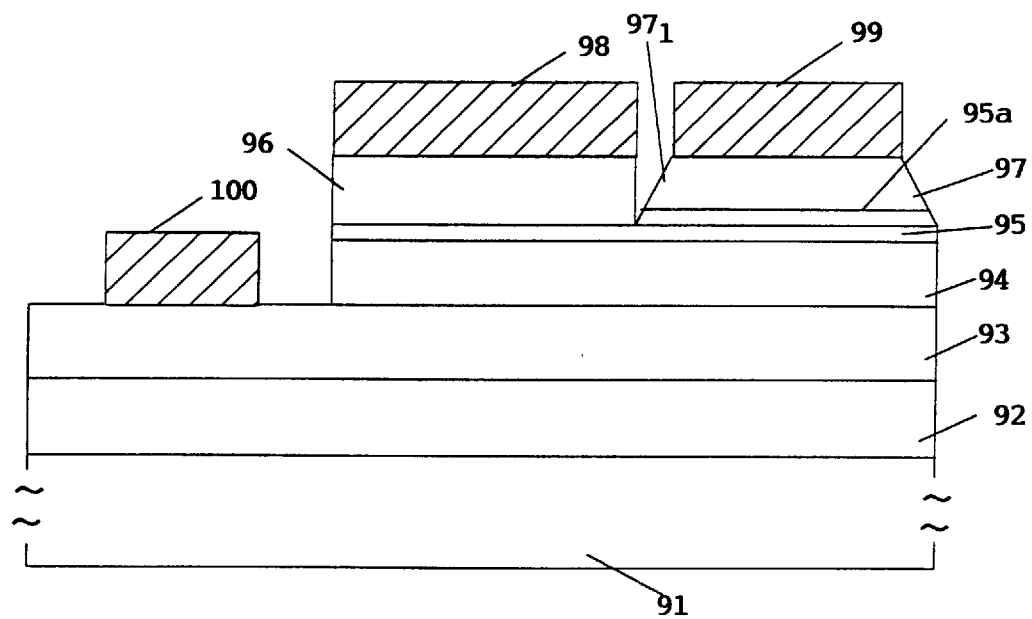
FIG. 19 is a diagram showing the construction of a HBT according to a fifth embodiment of the present invention.

FIG. 19 shows the construction of a HBT fabricated according to such a process.

Referring to FIG. 19, the HBT is constructed upon a semi-insulating GaAs substrate 91 that carries thereon an undoped GaAs buffer layer 92 with a thickness of about 600 nm. On the buffer layer 92, a collector contact layer 93 of $n^+$-type GaAs is formed with a thickness of about 200 nm, and a collector layer 94 of undoped GaAs is formed on the collector contact layer 93 with a thickness of about 200 nm. Further, the collector layer 94 carries thereon a very thin base layer 95 of p-type GaAs with a thickness of about 70 nm, and an emitter layer 96 of $n^+$-type AlGaAs is provided on the upper major surface of the base layer 95 in correspondence to a first region defined thereon. The emitter layer 96 may be formed by growing an $n^+$-type AlGaAs layer epitaxially, followed by a patterning process of the same.

Further, a base contact layer 97 of p-type GaAs is grown on the upper major surface of the base layer 95 in correspondence to a region adjacent to the region on which the emitter layer 96 is grown, wherein the base contact layer 97 is formed epitaxially and is defined laterally by an inclined crystal surface $97_1$. When growing the base contact layer 97, the present embodiment carries out a cleaning process in which the exposed surface of the base layer 95 is flushed by a gaseous organic material such as TMAs, DMAs, TMSb or TiPSb for removing impurities therefrom. Thereby, the resistance at the interface between the base layer 95 and the base contact layer 97 is successfully reduced. Particularly, by using a gaseous organic compound containing Sb such as TMSb or TiPSb, it is possible to increase the carrier concentration level of the interface, and the resistance is reduced further.

After the layered structure is thus formed, an emitter electrode 98 is provided on the emitter layer 96. Further, by providing a base electrode 99 and a collector electrode 100 respectively on the base contact layer 97 and on the collector contact layer 93, the fabrication of the HBT is completed.

Further, the present invention is not limited to the embodiments described heretofore, but various variations and modifications may be made without departing from the scope of the invention.

What is claimed is:

1. A compound semiconductor device, comprising:
   a channel layer of a first compound semiconductor material having a first bandgap;
   a barrier layer of a second compound semiconductor material having a second, substantially larger bandgap, said barrier layer being provided on said channel layer and including a first region having first thickness and second and third regions respectively having second and third thicknesses smaller than said first thickness, said second and third regions being disposed at both sides of said first region;
   a gate electrode provided on said barrier layer in Schottky contact therewith;
   a pair of ohmic electrodes provided respectively on said second and third regions in ohmic contact therewith as source and drain electrodes; and
   a pair of diffusion regions respectively extending from said pair of ohmic electrodes into said barrier layer, each of said diffusion regions reaching said channel layer.

2. A compound semiconductor device as claimed in claim 1, wherein upper surfaces of said second and third regions of said barrier layer are formed at a level above an upper major surface of said channel layer.

3. A compound semiconductor device as claimed in claim 1, wherein upper surfaces of said second and third regions of said barrier layer are formed at a level lower than a level of an upper surface of said first region of said barrier layer.

4. A compound semiconductor device as claimed in claim 1, wherein said channel layer contains dopants.

5. A compound semiconductor device as claimed in claim 1, wherein said channel layer is substantially free from dopants and wherein said channel layer contains therein a two-dimensional carrier electron gas.

6. A compound semiconductor device as claimed in claim 1, wherein upper surfaces of said second and third regions of said barrier layer are set such that depletion regions respectively associated with said second and third regions of said barrier layer do not cause a complete depletion in said channel layer.

7. The compound semiconductor of claim 1, further comprising a cap layer of a third compound semiconductor material having a third bandgap smaller than said second bandgap, said conductive cap layer being provided on said barrier layer.

8. A compound semiconductor device as claimed in claim 7, wherein said cap layer comprises an undoped semiconductor material.

9. The compound semiconductor of claim 1, wherein said second and third thicknesses of said second and third regions of said barrier layer are substantially the same thickness.

10. A semiconductor device, comprising:

an etching stopper layer of a first compound semiconductor material, said etching stopper layer having an upper major surface;

channel layer means for transporting carriers therethrough, said channel layer means having an upper boundary at a level equal to or lower than said upper major surface of said etching stopper layer, said channel layer means including a compound semiconductor material having a first bandgap;

a barrier layer of a second compound semiconductor material having a second bandgap substantially larger than said first bandgap, said barrier layer being provided upon said etching stopper layer and defined laterally by first and second, mutually opposing side walls;

a gate electrode provided on said barrier layer in Schottky contact therewith;

a first regrowth layer of a single crystal of a third compound semiconductor material having a bandgap substantially smaller than said second bandgap, said first regrowth layer being defined by a side wall of a crystal surface and provided upon said etching stopper layer in a state that said side wall of said first regrowth layer contacts with said first side wall of said barrier layer;

a second regrowth layer of a single crystal of said third compound semiconductor material, said second regrowth layer being defined by a side wall of a crystal surface and provided upon said etching stopper layer in a state that said side wall of said second regrowth layer contacts with said second side wall of said barrier layer;

a first ohmic electrode provided on said first regrowth layer in ohmic contact therewith as a source electrode; and a second ohmic electrode provided on said second regrowth layer in ohmic contact therewith as a drain electrode;

wherein said first compound semiconductor material has a composition such that said etching stopper is substantially immune to an etching process that is effective upon said second compound semiconductor material.

11. A semiconductor device as claimed in claim 10, wherein said semiconductor device includes a semiconductor layer acting simultaneously as said etching stopper layer and said channel layer means.

12. A semiconductor device as claimed in claim 10, wherein said etching stopper layer contains In.

13. A semiconductor device as claimed in claim 10, wherein said channel layer means comprises a channel layer provided below said etching stopper layer, said channel layer transporting carriers therethrough.

14. A semiconductor device as claimed in claim 13, wherein said second channel layer is defined laterally by first and second side walls, and wherein said first and second regrowth layers make contact with said second channel layer at said first and second side walls.

15. A semiconductor device as claimed in claim 10, wherein said channel layer means further includes a second channel layer above said etching stopper layer, said second channel layer transporting carriers therethrough.

16. A semiconductor device as claimed in claim 10, wherein said first and second regrowth layers have a bandgap substantially smaller than a bandgap of said barrier layer.

17. A compound semiconductor field effect transistor, comprising:

a channel layer of undoped first compound semiconductor material having a first bandgap;

a gate region provided on a first region defined on a major surface of said channel layer and laterally bounded by first and second, mutually opposing side walls, said gate region comprising a second compound semiconductor material of the p-type and having a second bandgap substantially larger than said first bandgap;

a source region provided on said major surface of said channel layer in correspondence to a second region defined at one side of said first region, said source region being bounded by a third side wall and comprising a third compound semiconductor material of the p-type;

a drain region provided on said major surface of said channel layer in correspondence to a third region defined at the other side of said first region with respect to said second region, said drain region being bounded by a fourth side wall and comprising a fourth compound semiconductor material of the p-type;

a gate electrode provided on said gate region in Schottky contact therewith;

a source electrode provided on said source region in ohmic contact therewith;

a drain electrode provided on said drain region in ohmic contact therewith; and a two-dimensional hole gas formed in said channel layer along said major surface;

said source region injecting holes into said two-dimensional hole gas at said first region across said major surface;

said drain region collecting holes from said two-dimensional hole gas at said second region across said major surface;

said third side wall comprising a crystal surface that contacts with said first side wall at an interface between said source region and said major surface of said channel layer, said crystal surface being inclined so as to separate from said first side wall at a level above said interface;

said fourth side wall comprising a crystal surface that contacts with said second side wall at an interface between said drain region and said major surface of said channel layer, said crystal surface being inclined so as to separate from said second side wall at a level above said interface;

wherein said channel layer carries, on said major surface thereof, a layer containing a p-type dopant with a concentration level higher than any of said source and drain regions, in correspondence to each of said first and second regions.

* * * * *